(12) United States Patent
Miki et al.

(10) Patent No.: US 8,907,334 B2
(45) Date of Patent: Dec. 9, 2014

(54) OXIDE FOR SEMICONDUCTOR LAYER OF THIN-FILM TRANSISTOR, SPUTTERING TARGET, AND THIN-FILM TRANSISTOR

(75) Inventors: Aya Miki, Kobe (JP); Yumi Iwanari, Kobe (JP); Toshihiro Kugimiya, Kobe (JP); Shinya Morita, Kobe (JP); Yasuaki Terao, Kobe (JP); Satoshi Yasuno, Kobe (JP); Jae Woo Park, Seongnam (KR); Je Hun Lee, Seoul (KR); Byung Du Ahn, Hwaseong (KR)

(73) Assignees: Kobe Steel, Ltd., Kobe-shi (JP); Samsung Display Co., Ltd., Yongin (KR)

( * ) Notice: Subject to any disclaimer, the term of this patent is extended or adjusted under 35 U.S.C. 154(b) by 168 days.

(21) Appl. No.: 13/642,314

(22) PCT Filed: Apr. 18, 2011

(86) PCT No.: PCT/JP2011/059554
§ 371 (c)(1),
(2), (4) Date: Oct. 19, 2012

(87) PCT Pub. No.: WO2011/132644
PCT Pub. Date: Oct. 27, 2011

(65) Prior Publication Data
US 2013/0032798 A1    Feb. 7, 2013

(30) Foreign Application Priority Data

Apr. 20, 2010  (JP) ................................ 2010-097350
Jul. 8, 2010   (JP) ................................ 2010-156232
Jan. 18, 2011  (JP) ................................ 2011-008324

(51) Int. Cl.
| | |
|---|---|
| *H01L 29/10* | (2006.01) |
| *H01L 29/786* | (2006.01) |
| *H01L 21/02* | (2006.01) |
| *H01L 29/66* | (2006.01) |

(52) U.S. Cl.
CPC ...... *H01L 29/7869* (2013.01); *H01L 21/02422* (2013.01); *H01L 21/02554* (2013.01); *H01L 21/02565* (2013.01); *H01L 21/02631* (2013.01); *H01L 29/66742* (2013.01); *H01L 29/78693* (2013.01)
USPC .............................................. 257/43; 438/85

(58) Field of Classification Search
CPC ............ H01L 29/7869; H01L 21/2565; H01L 29/78693
USPC .............................................. 257/43; 438/85
See application file for complete search history.

(56) References Cited

U.S. PATENT DOCUMENTS

| | | | |
|---|---|---|---|
| 7,906,777 B2 | 3/2011 | Yano et al. | |
| 2009/0267064 A1 | 10/2009 | Yano et al. | |

(Continued)

FOREIGN PATENT DOCUMENTS

| | | | |
|---|---|---|---|
| JP | 2007-142196 A | 6/2007 | |
| JP | 2009-123957 A | 6/2009 | |

(Continued)

OTHER PUBLICATIONS

International Search Report issued Jul. 19, 2011 in PCT/JP2011/059554.

(Continued)

*Primary Examiner* — Douglas Menz
(74) *Attorney, Agent, or Firm* — Oblon, Spivak, McClelland, Maier & Neustadt, L.L.P.

(57) ABSTRACT

Disclosed is an oxide for a semiconductor layer of a thin-film transistor, said oxide being excellent in the switching characteristics of a thin-film transistor, specifically enabling favorable characteristics to be stably obtained even in a region of which the ZnO concentration is high and even after forming a passivation layer and after applying stress. The oxide is used in a semiconductor layer of a thin-film transistor, and the aforementioned oxide contains Zn and Sn, and further contains at least one element selected from group X consisting of Al, Hf, Ta, Ti, Nb, Mg, Ga, and the rare-earth elements.

7 Claims, 16 Drawing Sheets

(56) References Cited

U.S. PATENT DOCUMENTS

| | | |
|---|---|---|
| 2009/0308635 A1 | 12/2009 | Yano et al. |
| 2010/0032666 A1 | 2/2010 | Yamazaki et al. |
| 2010/0108502 A1 | 5/2010 | Inoue et al. |
| 2010/0155717 A1 | 6/2010 | Yano et al. |
| 2010/0266787 A1 | 10/2010 | Yano et al. |
| 2011/0001136 A1 | 1/2011 | Hasegawa et al. |
| 2011/0121244 A1 | 5/2011 | Yano et al. |
| 2011/0240988 A1 | 10/2011 | Yano et al. |
| 2011/0260121 A1 | 10/2011 | Yano et al. |
| 2013/0248858 A1 | 9/2013 | Morita et al. |
| 2013/0270109 A1 | 10/2013 | Morita et al. |
| 2014/0054588 A1 | 2/2014 | Maeda et al. |

FOREIGN PATENT DOCUMENTS

| | | |
|---|---|---|
| JP | 2010-30824 A | 2/2010 |
| TW | 200939470 | 9/2009 |
| TW | 200731543 | 7/2013 |
| WO | WO 2010/023889 A1 | 3/2010 |

OTHER PUBLICATIONS

Office Action issued Mar. 27, 2012 in Japanese Patent Application No. 2011-008324 (with English-language translation).
Office Action issued Jul. 12, 2011 in Japanese Patent Application No. 2011-008324 (with English-language translation).
U.S. Appl. No. 13/812,277, filed Jan. 25, 2013, Morita, et al.
U.S. Appl. No. 14/113,322, filed Oct. 22, 2013, Maeda, et al.

(a)

(b)

(a)

(b)

(a)

(b)

(a)

(b)

(a)

(b)

(a)

(b)

(a)

(b)

(a)

(b)

(a)

(b)

(a)

(b)

OXIDE FOR SEMICONDUCTOR LAYER OF THIN-FILM TRANSISTOR, SPUTTERING TARGET, AND THIN-FILM TRANSISTOR

TECHNICAL FIELD

The present invention relates to an oxide for a semiconductor layer of a thin-film transistor to be used display devices such as a liquid crystal display, an organic EL display, or the like; a sputtering target for forming a film of the oxide; and a thin-film transistor.

BACKGROUND ART

As compared with widely used amorphous silicon (a-Si), an amorphous (noncrystalline) oxide semiconductor has high carrier mobility, a high optical band gap, and film formability at low temperature and, therefore, has been highly expected to be applied for next generation displays which are required to have a large size, high resolution, and high-speed drive, resin substrates which has low heat resistance, etc.

Examples of the oxide semiconductor include In-containing amorphous oxide semiconductors (In—Ga—Zn—O, In—Zn—O, etc.), however, since these oxide semiconductors use In which is rare metal, an increase in material cost is a serious concern in mass production process. Therefore, as an oxide semiconductor containing no In, produced at low material cost, and suitable for mass production, a ZTO-based oxide semiconductor made amorphous by adding Sn to Zn has been proposed (e.g. Patent Document 1).

PRIOR ART DOCUMENT

Patent Document

Patent Document 1; JP-A-2007-142196

SUMMARY OF THE INVENTION

Problems to be Solved by the Invention

In the case where an oxide semiconductor is used as a semiconductor layer for a thin-film transistor, the oxide semiconductor is required not only to have a high carrier concentration but also to be excellent in switching properties (transistor properties, TFT characteristics) of TFT. Specifically, the oxide semiconductor is required to satisfy (1) high ON-current maximum drain current when positive voltage is applied to a gate electrode and a drain electrode); (2) low OFF-current (drain current when negative voltage is applied to a gate electrode and positive voltage is applied to a drain electrode); (3) low S value (Subthreshold Swing, gate voltage required to increase drain current by one digit); (4) stability of threshold with the lapse of time (voltage at which drain current starts flowing when positive voltage is applied to a drain electrode and either positive or negative voltage is applied to a gate voltage, which is also referred to as threshold voltage) (it means uniform even in in-place of substrate); and the like.

Furthermore, a TFT using an oxide semiconductor layer of ZTO or the like is required to be excellent in resistance to voltage application and stress of light irradiation or the like (stress resistance). For example, when positive voltage or negative voltage is continuously applied to gate voltage or when light in a blue emitting band in which light absorption starts is continuously irradiated, the threshold voltage is changed (shifted) considerably, and it is pointed out that because of that, the switching properties of the TFT are changed. And for example, at the time of driving a liquid crystal panel or at the time of lighting a pixel by applying negative bias to a gate electrode, the TFT is irradiated with light leaked out from a liquid crystal cell and this light gives stress to the TFT to cause deterioration of the properties of the TFT. Particularly, shift of the threshold voltage leads to lowering of reliability in a display device itself such as a liquid crystal display or an organic EL display equipped with TFT, and, therefore, it has been desired to improve the stress resistance (small change before and after stress tests).

Incidentally, in the case of the ZTO-based oxide semiconductor, the carrier concentration tends to be high and in the process of forming a passivation layer (insulator layer) of a TFT element, a semiconductor layer is converted to be conductive, resulting in a problem that stable switching behavior cannot be obtained. For obtaining stable switching behavior, there is a process of lowering the ZnO concentration in the ZTO-based oxide semiconductor; however, in the case where the ZnO concentration is too much lowered, the conductivity of a sputtering target for forming the ZTO-based oxide semiconductor is lowered and it becomes difficult to carry out film formation by a DC sputtering process which is easily controlled and has simple apparatus configuration. Consequently, it is important how a material for a ZTO-based oxide semiconductor which can keep the ZnO concentration in a high degree can be designed.

The present invention was completed in view of the above-mentioned circumstances, and an object thereof is to provide an oxide for a semiconductor layer of a thin-film transistor which can give excellent switching properties and stress resistance to a thin-film transistor containing a ZTO-based oxide semiconductor, and stable and excellent TFT characteristics after passivation layer formation and stress tests, particularly even in a high ZnO concentration region; a thin-film transistor using the oxide; and a sputtering target to be used for forming the oxide.

Means for Solving the Problems

The present invention includes the following modes.

(1) An oxide to be used for a semiconductor layer of a thin-film transistor, wherein the oxide contains Zn and Sn and further contains at least one kind element selected from the X-group of consisting of Al, Hf, Ta, Ti, Nb, Mg, Ga, and rare earth elements.

(2) The oxide according to the (1), wherein in the case where the content (atomic %) of Zn and Sn contained in the oxide for a semiconductor layer is defined as [Zn] and [Sn], respectively, the ratio of [Zn]/([Zn]+[Sn]) is 0.8 or lower.

(3) The oxide according to the (1) or (2), wherein in the case where Ga is contained as the X-group element and the content (atomic %) of Ga contained in the oxide for a semiconductor layer is defined as [Ga], the ratio of [Ga]/([Zn]+[Sn]+[Ga]) is 0.01 or higher and 0.5 or lower, and in the case where an element (X1) other than Ga is contained as the X-group element and the total content (atomic %) of X1 contained in the oxide for a semiconductor layer is defined as [X1], the ratio of [X1]/([Zn]+[Sn]+[X1]) is 0.01 or higher and 0.3 or lower.

(4) A thin-film transistor having the oxide according to any one of the (1) to (3) as a semiconductor layer of the thin-film transistor.

(5) The thin-film transistor according to the (4), wherein the density of the semiconductor layer is 5.8 g/cm$^3$ or higher.

(6) A sputtering target for forming the oxide according to any one of the (1) to (3), wherein the sputtering target contains Zn and Sn and further contains at least one kind element selected from the X-group consisting of Al, Hf, Ta, Ti, Nb, Mg, Ga, and rare earth elements.
(7) The sputtering target according to the (6), wherein in the case where the content (atomic %) of Zn and Sn contained in the sputtering target is defined as [Zn] and [Sn], respectively, the ratio of [Zn]/([Zn]+[Sn]) is 0.8 or lower.
(8) The sputtering target according to the (6) or (7), wherein in the case where Ga is contained as the X-group element and the content (atomic %) of Ga contained in the sputtering target is defined as [Ga], the ratio of [Ga]/([Zn]+[Sn]+[Ga]) is 0.01 or higher and 0.5 or lower, and in the case where an element (X1) other than Ga is contained as the X-group element and the total content (atomic %) of X1 contained in the sputtering target is defined as [X1], the ratio of [X1]/([Zn]+[Sn]+[X1]) is 0.01 or higher and 0.3 or lower.

Effects of the Invention

According to the present invention, a ZTO-based oxide for a semiconductor layer excellent in switching properties and stress resistance for a thin-film transistor can be obtained. If the oxide for a semiconductor layer of the present invention is used, even in a region where the ZnO concentration in the oxide semiconductor is high (specifically, a region with approximately 0.6 or higher as the ratio of Zn in Zn and Sn constituting the oxide semiconductor (ratio)), it is possible to provide a thin-film transistor which can give stable and excellent properties after passivation layer formation and stress tests. As a result, if the above-mentioned thin-film transistor is used, a display device with high reliability can be obtained.

BRIEF DESCRIPTION OF THE DRAWINGS

FIG. 2(a) shows TFT characteristics before passivation layer formation: and FIG. 2(b) shows TFT characteristics after passivation layer formation.

FIG. 3(a) shows TFT characteristics before passivation layer formation: and FIG. 3(b) shows TFT characteristics after passivation layer formation.

FIG. 4(a) shows TFT characteristics before passivation layer formation: and FIG. 4(b) shows TFT characteristics after passivation layer formation.

FIG. 5(a) shows TFT characteristics before passivation layer formation: and FIG. 5(b) shows TFT characteristics after passivation layer formation.

FIG. 6(a) shows TFT characteristics before passivation layer formation: and FIG. 6(b) shows TFT characteristics after passivation layer formation.

FIG. 7(a) shows TFT characteristics before passivation layer formation: and FIG. 7(b) shows TFT characteristics after passivation layer formation.

FIG. 8(a) shows TFT characteristics before passivation layer formation: and FIG. 8(b) shows TFT characteristics after passivation layer formation.

FIG. 9(a) shows TFT characteristics before passivation layer formation: and FIG. 9(b) shows TFT characteristics after passivation layer formation.

FIG. 10(a) shows TFT characteristics before passivation layer formation: and FIG. 10(b) shows TFT characteristics after passivation layer formation.

FIG. 11(a) shows TFT characteristics before passivation layer formation: and FIG. 11(b) shows TFT characteristics after passivation layer formation.

MODE FOR CARRYING OUT THE INVENTION

Figure 1:
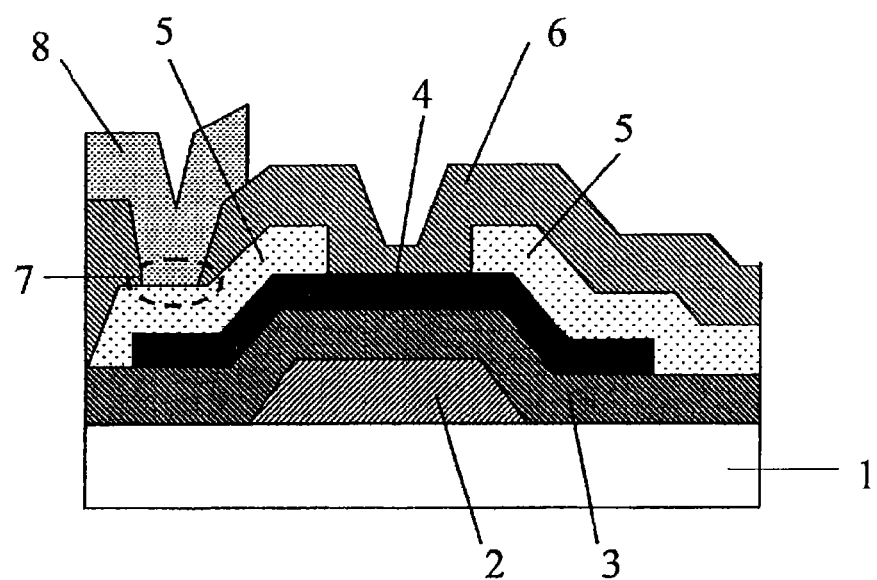
FIG. 1 is a schematic cross-sectional view for illustrating a thin-film transistor having an oxide semiconductor.

The inventors of the present invention have made various investigations in order to improve TFT characteristics (particularly, TFT characteristics after passivation layer formation and stress tests) in the case where an oxide (ZTO) containing Zn and Sn is used for an active layer (semiconductor layer) of TFT. As a result, they have found that an intended object is accomplished by using ZTO-X containing at least one kind element selected from the X-group consisting of Al, Hf, Ta, Ti, Nb, Mg, Ga, and rare earth elements in ZTO for a semiconductor layer of TFT, and completed the present invention. As shown in examples described below, a TFT containing an oxide semiconductor containing an element (X-group element) belonging to the above-mentioned X-group has been found to be significantly excellent in TFT characteristics particularly after passivation layer formation and stress tests, as compared with a TFT using conventional ZTO containing no X-group element.

That is, the oxide for a semiconductor layer of a thin-film transistor (TFT) of the present invention has a feature of containing Zn and Sn as well as at least one kind element selected from the X-group consisting of Al, Hf, Ta, Ti, Nb, Mg, Ga, and rare earth elements (which may be typified by an X-group element). In this specification, the oxide of the present invention may be represented by ZTO-X or ZTO+X.

First, metals (Zn and Sn) which are mother components and constitute the oxide of the present invention will be described.

Regarding the above-mentioned metals (Zn and Sn), the ratio of these metals is not particularly limited as long as an oxide containing these metals (ZTO) has an amorphous phase and falls within a range showing semiconductor properties. If a crystalline phase is formed, problems that the transistor properties become significantly uneven and the like may probably occur.

In the case where the content (atomic %) of Zn and Sn contained in the oxide for a semiconductor layer is defined as [Zn] and [Sn], respectively, the ratio of [Zn]/([Zn]+[Sn]) is preferably 0.8 or lower and in that case, desired TFT characteristics can be obtained. On the other hand, if the above-mentioned ratio becomes low, there occur problems that etching properties may be lowered and the like, and thus the ratio is preferably 0.2 or higher, and more preferably 0.3 or higher.

The oxide of the present invention contains the X-group element in ZTO. An addition of at least one kind X-group element selected from the group (X-group) consisting of Al, Hf, Ta, Ti, Nb, Mg, Ga, and rare earth elements to ZTO makes it possible to stably provide excellent TFT characteristics without converting ZTO-X to be conductive even in a region where the Zn amount is high. Further, it is also confirmed that the addition of the X-group element eliminates a problem of a defect in etching at the time of wet etching by experiments. These elements may be added alone or two or more thereof may be used in combination. Herein, "rare earth elements" means an element group including lanthanoid elements (in the periodic table, a total of 15 elements from La with an atomic number of 57 to Lu with an atomic number of 71), and in addition, Sc (scandium) and Y (yttrium), and one or two or more of the rare earth elements may be used.

Although a detailed mechanism for an improvement in properties by addition of the above-mentioned X-group element is unclear, it is supposed that the X-group elements are effective to suppress generation of oxygen deficiency which is a cause of excess electrons in the oxide semiconductor. It is considered that the addition of the X-group element lessens the oxygen deficiency and allows the oxide to have a stable structure and thus prevents the entire or surface of ZTO-X from being conducive.

The preferable ratio [X/(Zn+Sn+X)] of the X-group element contained in the entire metals (Zn, Sn, X-group element) constituting the oxide (ZTO-X) of the present invention is determined in consideration of the carrier density and stability of the semiconductor, and it is slightly different depending on the kind of the X-group element, and the upper limit of the preferable ratio can be made large in the case where Ga is contained as the X-group element, as compared with the case where Ga is not contained. Specifically, in the case where the content (atomic %) of Ga contained in the oxide (ZTO-X) is defined as [Ga], the preferable ratio of [Ga]/([Zn]+[Sn]+[Ga]) is 0.01 or higher and 0.5 or lower. On the other hand, in the case where an element (X1) other than Ga is contained as the X-group element and the total content (atomic %) of X1 contained in the oxide is defined as [X1], the preferable ratio of [X1]/([Zn]+[Sn]+[X1]) is 0.01 or higher and 0.3 or lower. It is more preferably 0.25 or lower, and even more preferably 0.2 or lower. The upper limit and lower limit of [X1]/([Zn]+[Sn]+[X1]) may be combined arbitrarily to define the range. Regarding [X1], in the case where two or more kinds of the X-group elements other than Ga are contained, it means the total amount thereof and the X-group element other than Ga is contained alone, it means the amount of the element itself. If the addition ratio of [Ga] or [X1] is too low, the effect of suppressing generation of oxygen deficiency may possibly become insufficient. On the other hand, if the addition ratio of [Ga] or [X1] is too high, the carrier density in the semiconductor is lowered or the mobility is decreased, and thus the ON current may tend to lower easily. The mobility is in a range of preferably 3 $cm^2/Vs$ or higher, more preferably 5 $cm^2/Vs$ or higher, and even more preferably 7.5 $cm^2/Vs$ or higher in a saturation region.

Although a detailed mechanism for an improvement in properties by addition of the above-mentioned X-group element is unclear, it is supposed that the X-group elements are effective to suppress generation of oxygen deficiency which is a cause of excess electrons in the oxide semiconductor. It is considered that addition of the X-group element lessens the oxygen deficiency and allows the oxide to have a stable structure and thus the stress resistance to stress by voltage or light or the like is improved.

The oxide of the present invention is described above.

The oxide is preferably formed in a film using a sputtering target (which may be hereinafter referred to as a "target") with a sputtering process. The oxide can be formed by a chemical film formation process such as a coating process; however, it is possible to easily form a thin film excellent in film in-plane uniformity of components and film thickness according to the sputtering process.

A thin film with a desired composition can be formed by properly constituting a material containing the above-mentioned elements with properly adjusted ratio of ZnO, $SnO_2$, and X-group element-O as the target to be used for the sputtering process. Specifically, an oxide target containing Zn and Sn as well as at least one kind element selected from the group (X-group) consisting of Al, Hf, Ta, Ti, Nb, Mg, Ga, and rare earth elements can be used as the target.

Alternatively, film formation may be carried out by a co-sputtering method for simultaneously discharging two targets with different compositions and consequently, an oxide semiconductor film with a different content of an X-element can be formed in in-place of the same substrate. For example, as shown in examples described below, a film of a desired ZTO-X oxide can be formed by a co-sputtering method using three targets; that is, a ZnO target, a ZTO (or $SnO_2$) target, and a target composed of an oxide of an X-group element.

The above-mentioned targets can be produced by, for example, a powder sintering method.

In the case of sputtering the above-mentioned target, it is preferable that the substrate temperature is adjusted to room temperature and the concentration of oxygen is controlled properly for the execution. The concentration of oxygen may be controlled properly in accordance with the configuration of a sputtering apparatus and the target composition, and it is preferable to add oxygen in such a manner that the carrier concentration of the oxide semiconductor is approximately $10^{15}$ to $10^{16}$ cm$^{-3}$. The concentration of oxygen in examples is controlled such that it satisfies $O_2/(Ar+O_2)=2\%$ in addition flow ratio.

Further, in the case where the above-mentioned oxide is used as the semiconductor layer of the TFT, the density of the oxide semiconductor layer is preferably 5.8 g/cm$^3$ or higher (described below), and in order to form a film of such an oxide, it is preferable to properly control the gas pressure during sputtering, the power input to a sputtering target, the substrate temperature, and the like. For example, if the gas pressure is made low at the time of film formation, scattering of sputtered atoms one another can be prevented and it is supposed to be possible to form a compact (highly dense) film, and due to that, it is good as the entire gas pressure at the time of film formation is low to an extent that the discharge for sputtering is stabilized, and the pressure may be controlled preferably in a range of approximately 0.5 to 5 mTorr and more preferably in a range of 1 to 3 mTorr. It is good as the power input is high, and it is recommended to set the power input of DC or RF to approximately 2.0 W/cm$^2$ or higher. It is also good as the substrate temperature at the time of film formation is high, and it is recommended to set the temperature to a range around room temperature to 200° C.

The film thickness of the oxide formed into a film as described above is preferably 30 nm or more and 200 nm or less, and more preferably 30 nm or more and 150 nm or less.

The present invention also encompasses a TFT having the above-mentioned oxide as a semiconductor layer of the TFT. The TFT may have at least a gate electrode, a gate insulator layer, a semiconductor layer of the above-mentioned oxide, a source electrode, a drain electrode, and a passivation layer (insulator layer) on a substrate, and its configuration is not particularly limited as long as it is used commonly.

Herein, the density of the oxide semiconductor layer is preferably 5.8 g/cm$^3$ or higher. If the density of the oxide semiconductor layer is high, defects in the film are decreased to improve the film quality, and also since the interatomic distance is narrowed, the electron field-effect mobility of a TFT element is significantly increased and the electric conductivity becomes high and the stability to stress by light irradiation is improved. The density of the oxide semiconductor layer is good as it is higher, and it is more preferably 5.9 g/cm$^3$ or more and further preferably 6.0 g/cm$^3$ or more. The density of the oxide semiconductor layer is measured by a method described in examples below.

Hereinafter, by referring to FIG. 1, embodiments of a method for producing the above-mentioned TFT will be described. FIG. 1 and the following production method describe one example of preferred embodiments of the present invention, and it is not intended that the present invention be limited thereto. For example, FIG. 1 shows a TFT with a bottom gate type structure, however, the TFT is not limited thereto, and the TFT may be a top gate type TFT having a gate insulator layer and a gate electrode successively on an oxide semiconductor layer.

As shown in FIG. 1, a gate electrode 2 and a gate insulator layer 3 are formed on a substrate 1 and an oxide semiconductor layer 4 is formed further thereon. A source-drain electrode 5 is formed on the oxide semiconductor layer 4 and a passivation layer (insulator layer) 6 is formed thereon and a transparent conductive film 8 is electrically connected to the drain electrode 5 through a contact hole 7.

A method for forming the gate electrode 2 and the gate insulator layer 3 on the substrate 1 is not particularly limited and methods commonly used can be adopted. The kinds of the substrate 1, the gate electrode 2, and the gate insulator layer 3 are not also particularly limited and widely used ones can be used. For example, glass or the like can be used preferably for the substrate 1. Further, metals such as Al and Cu with low electric resistance and their alloys can be preferably used for the gate electrode 2. Typical examples of the gate insulator layer 3 include a silicon oxide film, a silicon nitride film, and a silicon oxynitride film or the like. Additionally, oxides such as $Al_2O_3$ and $Y_2O_3$ and those formed by layering them can be also used.

Next, the oxide semiconductor layer 4 is formed. The oxide semiconductor layer 4 is preferable to be formed into a film by, as described above, a DC sputtering method or an RF sputtering method using a sputtering target with the same composition as that of the thin film. Alternatively, the film formation may be carried out by a co-sputtering method.

After wet etching, the oxide semiconductor layer 4 is subjected to patterning. It is preferable to carry out heat treatment (pre-annealing) for improving the film quality of the oxide semiconductor layer 4 immediately after the patterning and accordingly, the ON current and electron field-effect mobility, which are transistor properties, are increased and the transistor performance is improved.

After pre-annealing, the source-drain electrode 5 is formed. The kind of the source-drain electrode 5 is not particularly limited and widely used ones can be used. For example, similarly to the gate electrode 2, metals such as Al and Cu and their alloys may be used, or pure Ti as described in examples below may be used.

A method for forming the source-drain electrode 5 may be carried out by, for example, forming a metal thin film by a magnetron sputtering method and forming the metal thin film into the source-drain electrode 5 by a lift-off method. Alternatively, there is a method for forming the source-drain electrode 5 by previously forming a prescribed metal thin film by a sputtering method and thereafter forming the electrode by patterning, not forming the electrode by the lift-off method as described above; however, this method may possibly deteriorate the transistor characteristics since the oxide semiconductor layer is damaged at the time of etching of the electrode. Therefore, in order to avoid such problems, a method including previously forming a passivation layer on the oxide semiconductor layer, and subsequently forming the electrode by patterning is adopted, and this method is used in examples described below.

Next, the passivation layer (insulator layer) 6 is formed on the oxide semiconductor layer 4 by a CVD (Chemical Vapor Deposition) method. The surface of the oxide semiconductor layer 4 may possibly be converted easily to be conductive by plasma-induced damage due to CVD (it is supposedly attributed to that oxygen deficiency formed on the surface of the oxide semiconductor becomes an electron donor), and in order to avoid the problems, $N_2O$ plasma irradiation is carried out before film formation of the passivation layer in examples described below. The condition described in the following document is adopted as the $N_2O$ plasma irradiation condition, and the content is incorporated herein by reference.

J. Park, et. al, Appl. Phys. Lett., 1993, 053505 (2008).

Next, according to a common method, the transparent conductive film 8 is electrically connected to the drain electrode 5 through the contact hole 7. The kinds of the transparent conductive film and drain electrode are not particularly limited, and those which are used commonly can be used. As the transparent conductive film, ITO, IZO, or the like can be preferably used. In addition, materials exemplified for the above-mentioned source-drain electrodes can be used for the drain electrode.

EXAMPLES

Below, by way of examples, the present invention will be more specifically described. However, the present invention is not limited by the following examples. It is naturally understood that modifications may be properly made and practiced within the scope adaptable to the gists described above and below. All of these are included in the technical scope of the present invention.

Example 1

According to the above-mentioned method, a thin-film transistor (TFT) shown in FIG. 1 was produced and the TFT characteristics before and after passivation layer formation were evaluated.

First, a Ti thin film with a thickness of 100 nm as a gate electrode and a gate insulator layer $Si_{O2}$ (200 nm) were successively formed on a glass substrate (EAGLE 2000 manufactured by Corning Incorporated, diameter 100 mm×thickness 0.7 mm). The gate electrode was formed by using a pure Ti sputtering target by a DC sputtering method in conditions as follows: film formation temperature: room temperature, film formation power: 300 W, carrier gas: Ar, and gas pressure: 2 mTorr. Further, the gate insulator layer was formed by a plasma CVD method in conditions as follows: carrier gas: mixed gas of $SiH_4$ and $N_2O$, film formation power: 100 W, and film formation temperature: 300° C.

Next, oxide thin films with various compositions as described in Table 1 were formed by a sputtering method using sputtering targets (described below). As the oxide thin films, besides ZTO-X (example of the present invention) containing an X-group element in ZTO, ZTO (conventional example) containing no X-group element was also formed for comparison. An apparatus used for the sputtering was "CS-200" manufactured by ULVAC, Inc. and the sputtering conditions were as follows.

Substrate temperature: room temperature
Gas pressure: 5 mTorr
Oxygen partial pressure: $O_2/(Ar+O_2)=2\%$
Film thickness: 50 to 150 nm
Size of target used: φ4 inch×5 mm At the time of film formation of ZTO (conventional example), the film formation was carried out by a co-sputtering method for simultaneously discharging an oxide target (ZTO) at a ratio (atomic % ratio) Zn:Sn of 6:4 and a ZnO target. At the time of film formation of an oxide thin film of ZTO containing an X-group element, the film formation was carried out by a co-sputtering method for simultaneously discharging the targets used for the film formation of ZTO [that is, the oxide target (ZTO) at a ratio (atomic % ratio) Zn:Sn of 6:4 and the ZnO target] and an oxide target of the X-group element.

The contents of the respective metal elements in the oxide thin films obtained in this manner were analyzed by XPS (X-ray Photoelectron Spectroscopy). More in detail, after sputtering to a depth of about 1 nm from the outermost surface by Ar ion, the analysis was carried out in the following conditions.

X-ray source: Al $K_α$
X-ray output: 350 W
Photoelectron take-off angle: 20°

After each oxide thin film was formed in the above-mentioned manner, patterning was carried out by photolithography and wet etching. A wet etchant used was "ITO-07N" manufactured by Kanto Chemical Co., Inc. In this example, the wet etchability of each oxide thin film subjected to the experiment was evaluated by optical microscopic observation. It is confirmed according to the evaluation results that no residue by wet etching was observed in all of the compositions subjected to the experiment and etching was carried out properly.

After patterning of each oxide semiconductor film, pre-annealing treatment was carried out in order to improve the film quality. The pre-annealing was carried out at 350° C. for 1 hour in atmospheric pressure.

Next, a source-drain electrode was formed by a lift-off method using pure Ti. Specifically, after patterning was carried out using a photoresist, a Ti thin film was formed by a DC sputtering method (film thickness 100 nm). A method for forming the Ti thin film for a source-drain electrode is the same as that in the case of the gate electrode described above. Next, an unnecessary photoresist was removed by an ultrasonic washing apparatus in acetone to give TFT with a channel length of 10 μm and a channel width of 200 μm.

After the source-drain electrode was formed as described above, a passivation layer was formed to protect each oxide semiconductor layer. As the passivation layer, a layered film (total film thickness 400 nm) of $SiO_2$ (film thickness 200 nm) and SiN (film thickness 200 nm) was used. The above-mentioned $SiO_2$ and SiN were formed by a plasma CVD method using "PD-220NL" manufactured by SAMCO Inc. In this example, after plasma treatment was carried out by $N_2O$ gas, the $SiO_2$ film and the SiN film were successively formed. A mixed gas of $N_2O$ and $SHO_4$ was used for the formation of the $SiO_2$ film and a mixed gas of $SiH_4$, $N_2$ and $NH_3$ was used for the formation of the SiN film. In both cases, the film formation power was set to 100 W and the film formation temperature was set to 150° C.

Next, a contact hole for probing for evaluating transistor characteristics was formed in the passivation layer by photolithography and dry etching. Next, an ITO film (film thickness 80 nm) was formed using a DC sputtering method in conditions as follows: carrier gas: mixed gas of argon gas and oxygen gas, film formation power: 200 W, and gas pressure: 5 mTorr, to produce a TFT shown in FIG. 1.

Each TFT obtained as described above was subjected to investigations as follows: (1) transistor characteristics (drain current-gate voltage characteristics, Id-Vg characteristics), (2) threshold voltage, and (3) S value before and after passivation layer formation.

(1) Measurement of Transistor Characteristics

The transistor characteristics were measured by using a semiconductor parameter analyzer, "4156C" manufactured by National Instruments Inc. The detailed measurement conditions were as follows. In this example, ON current (Ion) at Vg=30V was calculated.

Source voltage: 0V
Drain voltage: 10V
Gate voltage: −30 to 30V (measurement interval: 1V)

(2) Threshold Voltage (Vth)

The threshold voltage is roughly a value of gate voltage at the time when a transistor is sifted from OFF state (state where drain current is low) to ON state (state where drain current is high). In this example, the voltage in the case where the drain current is around 1 nA between ON current and OFF current is defined as the threshold voltage, and the threshold voltage of each TFT was measured.

(3) S Value

The S value was defined as the minimum value of the gate voltage necessary for increasing the drain current by one digit.

Their results are shown in Table 1 and Table 2. Table 1 shows respective values of ON current (Ion), threshold voltage, and S value before and after passivation layer formation. In this example, in the case where Ion≥1×10$^{-5}$ A, −10V≤Vth≤10V, and S≤1.0V/dec, it was determined that each characteristic was good. The determination result was shown in the most right column of Table 1 and Table 2, and those which were good in all characteristics before and after passivation layer formation were marked with ○ and those which were inferior in any one of the characteristics were marked with X. In the following tables and figures, "E−0X" means E×10$^{-0X}$. For example, 2.E−04 means 2'10$^{-4}$.

TABLE 1

| No. | Oxide | Ratio to [Zn] + [Sn] [Zn] | [Sn] | [X]/ ([Zn] + [Sn] + [X]) | Before passivation layer formation Ion (A) | S (V/dec) | Vth (V) | After passivation layer formation Ion (A) | S (V/dec) | Vth (V) | Evaluation |
|---|---|---|---|---|---|---|---|---|---|---|---|
| 1 | ZTO | 0.70 | 0.30 | 0 | 2.E−04 | 0.4 | −6 | 7.E−04 | Unmeasurable | Unmeasurable | X |
| 2 |  | 0.65 | 0.35 | 0 | 2.E−03 | 0.6 | −1 | 1.E−03 | 1.5 | 1 | X |
| 3 | ZTO + Al | 0.70 | 0.30 | 0.04 | 1.E−03 | 0.4 | 2 | 5.E−04 | 0.5 | 1 | ○ |
| 4 |  | 0.70 | 0.30 | 0.15 | 6.E−04 | 0.4 | 0 | 3.E−04 | 0.6 | 3 | ○ |
| 5 |  | 0.70 | 0.30 | 0.25 | 3.E−04 | 0.5 | 1 | 2.E−04 | 0.7 | 5 | ○ |
| 6 |  | 0.70 | 0.30 | 0.30 | 4.E−05 | 0.9 | 5 | 2.E−04 | 0.9 | 8 | ○ |
| 7 |  | 0.60 | 0.40 | 0.40 | 8.E−04 | 0.3 | 3 | 8.E−06 | 0.3 | 1 | X |
| 8 | ZTO + Hf | 0.65 | 0.35 | 0.02 | 9.E−04 | 0.4 | −1 | 5.E−04 | 0.3 | 1 | ○ |
| 9 |  | 0.65 | 0.35 | 0.15 | 5.E−04 | 0.5 | −2 | 3.E−04 | 0.3 | 3 | ○ |
| 10 |  | 0.60 | 0.40 | 0.25 | 3.E−04 | 0.5 | 1 | 1.E−04 | 0.4 | 4 | ○ |
| 11 |  | 0.65 | 0.35 | 0.30 | 1.E−04 | 0.6 | 1 | 1.E−04 | 0.5 | 6 | ○ |
| 12 |  | 0.60 | 0.40 | 0.40 | 1.E−05 | 0.7 | 9 | 1.E−05 | 0.7 | 11 | X |
| 13 | ZTO + Ta | 0.60 | 0.40 | 0.02 | 8.E−04 | 0.3 | 0 | 8.E−04 | 0.4 | 0 | ○ |
| 14 |  | 0.60 | 0.40 | 0.15 | 4.E−04 | 0.3 | 1 | 5.E−04 | 0.4 | 1 | ○ |
| 15 |  | 0.60 | 0.40 | 0.25 | 2.E−04 | 0.4 | 2 | 2.E−04 | 0.5 | 2 | ○ |
| 16 |  | 0.60 | 0.40 | 0.30 | 1.E−04 | 0.5 | 3 | 1.E−04 | 0.5 | 3 | ○ |
| 17 |  | 0.60 | 0.40 | 0.40 | 4.E−05 | 0.7 | 7 | 5.E−05 | 1.1 | 4 | X |
| 18 |  | 0.55 | 0.45 | 0.15 | 6.E−04 | 0.3 | 2 | 6.E−04 | 0.3 | 1 | ○ |
| 19 |  | 0.50 | 0.50 | 0.15 | 7.E−04 | 0.3 | 1 | 6.E−04 | 0.3 | 2 | ○ |
| 20 |  | 0.40 | 0.60 | 0.15 | 8.E−04 | 0.3 | 1 | 3.E−04 | 0.3 | 2 | ○ |
| 21 |  | 0.85 | 0.20 | 0.15 | 5.E−06 | 0.5 | −1 | 4.E−05 | 3.6 | Unmeasurable | X |
| 22 | ZTO + Ti | 0.60 | 0.40 | 0.04 | 4.E−04 | 0.3 | 1 | 4.E−04 | 0.4 | 1 | ○ |
| 23 |  | 0.55 | 0.45 | 0.15 | 3.E−04 | 0.3 | 3 | 2.E−04 | 0.5 | 2 | ○ |
| 24 |  | 0.50 | 0.50 | 0.25 | 1.E−04 | 0.5 | 4 | 1.E−04 | 0.6 | 3 | ○ |
| 25 |  | 0.40 | 0.60 | 0.30 | 2.E−04 | 0.5 | 5 | 1.E−04 | 0.7 | 4 | ○ |
| 26 |  | 0.85 | 0.20 | 0.04 | 4.E−06 | 0.6 | 0 | 2.E−04 | Unmeasurable | Unmeasurable | X |
| 27 | ZTO + Nb | 0.65 | 0.35 | 0.04 | 5.E−04 | 0.3 | 1 | 5.E−04 | 0.4 | 1 | ○ |
| 28 |  | 0.65 | 0.35 | 0.15 | 3.E−04 | 0.4 | 2 | 3.E−04 | 0.4 | 2 | ○ |
| 29 |  | 0.65 | 0.35 | 0.25 | 2.E−04 | 0.5 | 3 | 2.E−04 | 0.5 | 3 | ○ |
| 30 |  | 0.65 | 0.35 | 0.30 | 6.E−05 | 0.7 | 4 | 3.E−05 | 0.6 | 4 | ○ |
| 31 |  | 0.75 | 0.25 | 0.40 | 7.E−07 | 0.8 | 0 | 8.E−05 | Unmeasurable | Unmeasurable | X |
| 32 | ZTO + Mg | 0.65 | 0.35 | 0.04 | 8.E−04 | 0.3 | 2 | 5.E−04 | 0.3 | 2 | ○ |
| 33 |  | 0.55 | 0.45 | 0.15 | 5.E−04 | 0.3 | 3 | 4.E−04 | 0.5 | 3 | ○ |
| 34 |  | 0.50 | 0.50 | 0.25 | 3.E−04 | 0.4 | 3 | 2.E−04 | 0.5 | 3 | ○ |
| 35 |  | 0.55 | 0.45 | 0.30 | 2.E−04 | 0.5 | 4 | 1.E−04 | 0.6 | 5 | ○ |
| 36 |  | 0.65 | 0.35 | 0.40 | 2.E−05 | 0.6 | 5 | 1.E−04 | 1.4 | 11 | X |

TABLE 2

| No. | Oxide | Ratio to [Zn] + [Sn] [Zn] | [Sn] | [X]/ ([Zn] + [Sn] + [X]) | Before passivation layer formation Ion (A) | S (V/dec) | Vth (V) | After passivation layer formation Ion (A) | S (V/dec) | Vth (V) | Evaluation |
|---|---|---|---|---|---|---|---|---|---|---|---|
| 1 | ZTO + Sc | 0.60 | 0.40 | 0.01 | 3.E−04 | 0.5 | 1 | 6.E−04 | 0.6 | 0 | ○ |
| 2 |  | 0.55 | 0.45 | 0.15 | 2.E−04 | 0.6 | 2 | 4.E−04 | 0.6 | 1 | ○ |
| 3 |  | 0.85 | 0.25 | 0.15 | 4.E−06 | 0.8 | Unmeasurable | 1.E−05 | Unmeasurable | Unmeasurable | X |
| 4 |  | 0.40 | 0.60 | 0.15 | 3.E−04 | 0.4 | 3 | 5.E−04 | 0.5 | 1 | ○ |
| 5 |  | 0.65 | 0.35 | 0.40 | 1.E−06 | 1.3 | 8 | 1.E−05 | 1.4 | 8 | X |
| 6 | ZTO + Y | 0.60 | 0.40 | 0.04 | 8.E−04 | 0.4 | 0 | 8.E−04 | 0.4 | 0 | ○ |
| 7 |  | 0.55 | 0.45 | 0.15 | 7.E−04 | 0.4 | 2 | 6.E−04 | 0.5 | 1 | ○ |
| 8 |  | 0.50 | 0.50 | 0.25 | 4.E−04 | 0.5 | 2 | 2.E−04 | 0.5 | 2 | ○ |
| 9 |  | 0.40 | 0.60 | 0.30 | 2.E−04 | 0.7 | 2 | 2.E−04 | 0.9 | 5 | ○ |
| 10 |  | 0.65 | 0.35 | 0.40 | 6.E−06 | 1.7 | 5 | 1.E−04 | Unmeasurable | Unmeasurable | X |
| 11 | ZTO + La | 0.55 | 0.45 | 0.02 | 3.E−04 | 0.5 | 1 | 6.E−04 | 0.6 | 0 | ○ |
| 12 |  | 0.55 | 0.45 | 0.15 | 2.E−04 | 0.6 | 2 | 4.E−04 | 0.6 | 1 | ○ |
| 13 |  | 0.85 | 0.25 | 0.20 | 4.E−06 | 1.2 | Unmeasurable | 1.E−05 | Unmeasurable | Unmeasurable | X |
| 14 |  | 0.40 | 0.60 | 0.30 | 3.E−04 | 0.6 | 3 | 4.E−04 | 0.7 | 1 | ○ |
| 15 |  | 0.65 | 0.35 | 0.40 | 1.E−06 | 1.7 | 10 | 1.E−07 | Unmeasurable | 8 | X |
| 16 | ZTO + Ga | 0.60 | 0.40 | 0.04 | 2.E−03 | 0.3 | 0 | 2.E−03 | 0.4 | −3 | ○ |
| 17 |  | 0.55 | 0.45 | 0.15 | 1.E−03 | 0.3 | 1 | 1.E−03 | 0.4 | −2 | ○ |
| 18 |  | 0.50 | 0.50 | 0.30 | 1.E−03 | 0.3 | 1 | 1.E−03 | 0.5 | −2 | ○ |

TABLE 2-continued

| No. | Oxide | Ratio to [Zn] + [Sn] [Zn] | [Sn] | [X]/ ([Zn] + [Sn] + [X]) | Before passivation layer formation | | | After passivation layer formation | | | Evaluation |
|---|---|---|---|---|---|---|---|---|---|---|---|
| | | | | | Ion (A) | S (V/dec) | Vth (V) | Ion (A) | S (V/dec) | Vth (V) | |
| 19 | | 0.40 | 0.60 | 0.40 | 9.E−04 | 0.4 | 2 | 1.E−03 | 0.7 | −1 | ◯ |
| 20 | | 0.60 | 0.40 | 0.40 | 8.E−04 | 0.4 | 1 | 8.E−04 | 0.4 | −2 | ◯ |
| 21 | | 0.55 | 0.45 | 0.45 | 7.E−04 | 0.6 | 3 | 1.E−03 | 0.5 | −3 | ◯ |
| 22 | ZTO + Al + Ta | 0.70 | 0.30 | Al: 0.02 Ta: 0.02 | 8.E−04 | 0.5 | 1 | 6.E−04 | 0.5 | 1 | ◯ |
| 23 | | 0.70 | 0.30 | Al: 0.05 Ta: 0.1 | 6.E−04 | 0.5 | 2 | 4.E−04 | 0.6 | 2 | ◯ |
| 24 | | 0.60 | 0.40 | Al: 0.1 Ta: 0.1 | 5.E−04 | 0.4 | 1 | 4.E−04 | 0.6 | 3 | ◯ |
| 25 | ZTO + Al + La | 0.70 | 0.30 | Al: 0.02 La: 0.02 | 8.E−04 | 0.5 | 1 | 6.E−04 | 0.5 | 1 | ◯ |
| 26 | ZTO + Al + Ga | 0.70 | 0.30 | Al: 0.05 Ga: 0.1 | 6.E−04 | 0.4 | 0 | 4.E−04 | 0.5 | 0 | ◯ |
| 27 | ZTO + Ta + Ga | 0.60 | 0.40 | Ta: 0.1 Ga: 0.1 | 7.E−04 | 0.4 | −1 | 6.E−04 | 0.6 | 1 | ◯ |
| 28 | ZTO + Al + La | 0.70 | 0.30 | Al: 0.1 La: 0.05 | 3.E−04 | 0.5 | 0 | 4.E−04 | 0.6 | 0 | ◯ |

In Table 1 and Table 2, for example, ZTO+Al (No. 3 in Table 1) show an example containing Al as the X-group element. More in detail, it means that the metals of the oxide are Zn, Sn, and Al and the atomic ratio of [Al] to [Zn]+[Sn]+[Al] is 0.04 and the atomic ratio of [Zn] to [Zn]+[Sn] is 0.70. Similarly, No. 25 in Table 2 shows a composite addition example containing both Al and La as the X-group element (X=Al+La) and the metals of the oxide are Zn, Sn, Al, and La. More in detail, the atomic ratio of [Al] to [Zn]+[Sn]+[Al]+[La] is 0.02, the atomic ratio of [La] to [Zn]+[Sn]+[Al]+[La] is 0.02, and the atomic ratio of [Zn] to [Zn]+[Sn] is 0.70.

FIGS. 2 to 11 show the results of drain current-gate voltage properties (Id-Vg properties) before and after passivation layer formation in the case of using various kinds of oxides. FIGS. 2(a) and 2(b) show the results of a conventional example using ZTO and FIGS. 3 to 11 show the results of the case where ZTO+X containing the X-group element defined in the present invention is used.

In the respective figures, (a) shows the result before passivation layer formation and (b) shows the result after passivation layer formation.

FIGS. 3(a) and 3(b) show an example of the case where Al is contained as the X-group element and the metals of the oxide are Zn, Sn, and Al and the atomic ratio of [Al] to [Zn]+[Sn]+[Al] is 0.04 and the atomic ratio of [Zn] to [Zn]+[Sn] is 0.7.

FIGS. 4(a) and 4(b) show an example of the case where Hf is contained as the X-group element and the metals of the oxide are Zn, Sn, and Hf and the atomic ratio of [Hf] to [Zn]+[Sn]+[Hf] is 0.04 and the atomic ratio of [Zn] to [Zn]+[Sn] is 0.65.

FIGS. 5(a) and 5(b) show an example of the case where Ta is contained as the X-group element and the metals of the oxide are Zn, Sn, and Ta and the atomic ratio of [Ta] to [Zn]+[Sn]+[Ta] is 0.04 and the atomic ratio of [Zn] to [Zn]+[Sn] is 0.6.

FIGS. 6(a) and 6(b) show an example of the case where Ti is contained as the X-group element and the metals of the oxide are Zn, Sn, and Ti and the atomic ratio of [Ti] to [Zn]+[Sn]+[Ti] is 0.04 and the atomic ratio of [Zn] to [Zn]+[Sn] is 0.65.

FIGS. 7(a) and 7(b) show an example of the case where Nb is contained as the X-group element and the metals of the oxide are Zn, Sn, and Nb and the atomic ratio of [Nb] to [Zn]+[Sn]+[Nb] is 0.04 and the atomic ratio of [Zn] to [Zn]+[Sn] is 0.6.

FIGS. 8(a) and 8(b) show an example of the case where Mg is contained as the X-group element and the metals of the oxide are Zn, Sn, and Mg and the atomic ratio of [Mg] to [Zn]+[Sn]+[Mg] is 0.04 and the atomic ratio of [Zn] to [Zn]+[Sn] is 0.65.

FIGS. 9(a) and 9(b) show an example of the case where Sc is contained as the X-group element and the metals of the oxide are Zn, Sn, and Sc and the atomic ratio of [Sc] to [Zn]+[Sn]+[Sc] is 0.04 and the atomic ratio of [Zn] to [Zn]+[Sn] is 0.6.

FIGS. 10(a) and 10(b) show an example of the case where Y is contained as the X-group element and the metals of the oxide are Zn, Sn, and Y and the atomic ratio of [Y] to [Zn]+[Sn]+[Y] is 0.04 and the atomic ratio of [Zn] to [Zn]+[Sn] is 0.65.

FIGS. 11(a) and 11(b) show an example of the case where Ga is contained as the X-group element and the metals of the oxide are Zn, Sn, and Ga and the atomic ratio of [Ga] to [Zn]+[Sn]+[Ga] is 0.04 and the atomic ratio of [Zn] to [Zn]+[Sn] is 0.6.

First, the results of a conventional example using ZTO will be discussed.

Figure 2:
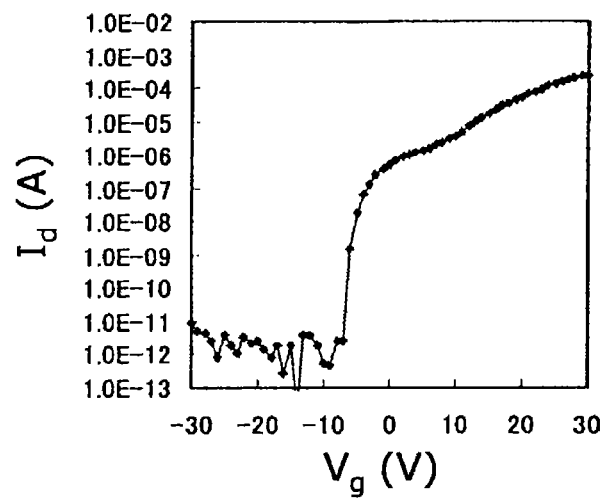
FIGS. 2(a) and 2(b) are views showing TFT characteristics before and after passivation layer formation in the case where ZTO (conventional example) is used.
Figure 2:
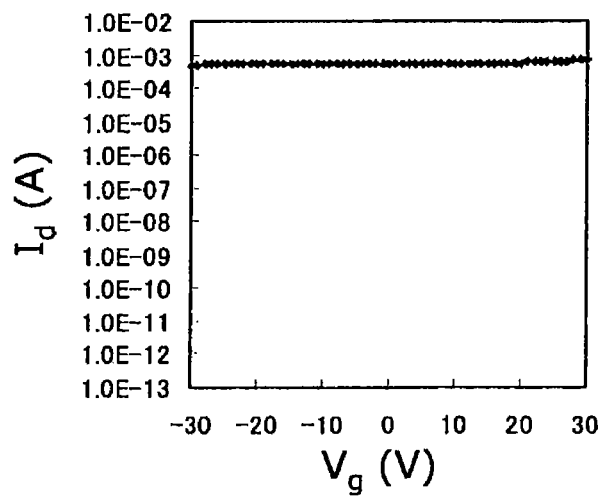
Figure 3:
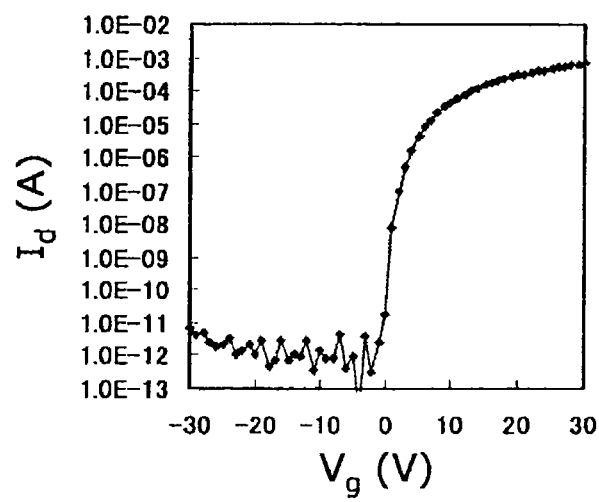
FIGS. 3(a) and 3(b) are views showing TFT characteristics before and after passivation layer formation in the case where ZTO-Al is used.
Figure 3:
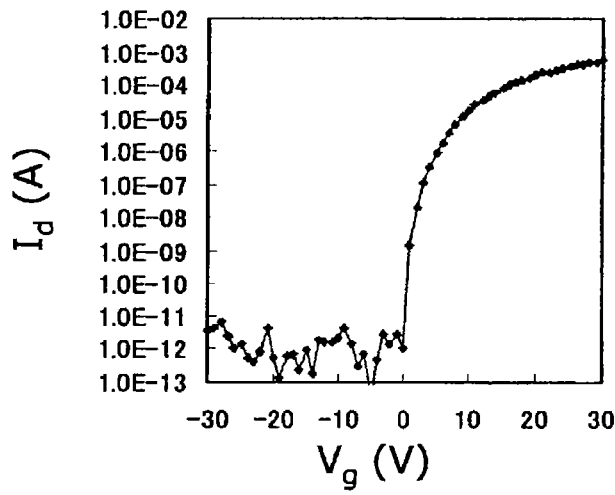
Figure 4:
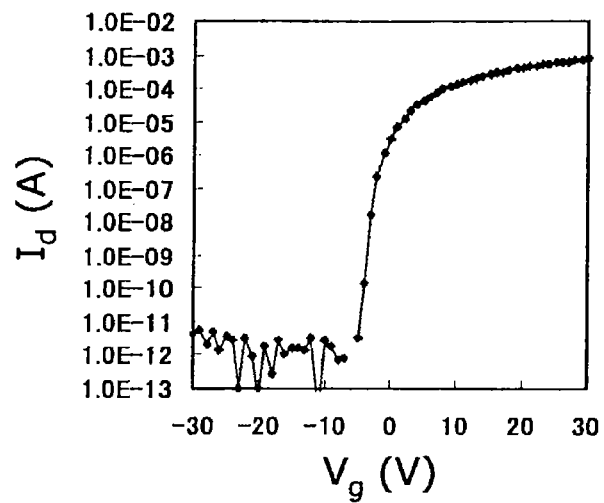
FIGS. 4(a) and 4(b) are views showing TFT characteristics before and after passivation layer formation in the case where ZTO-Hf is used.
Figure 4:
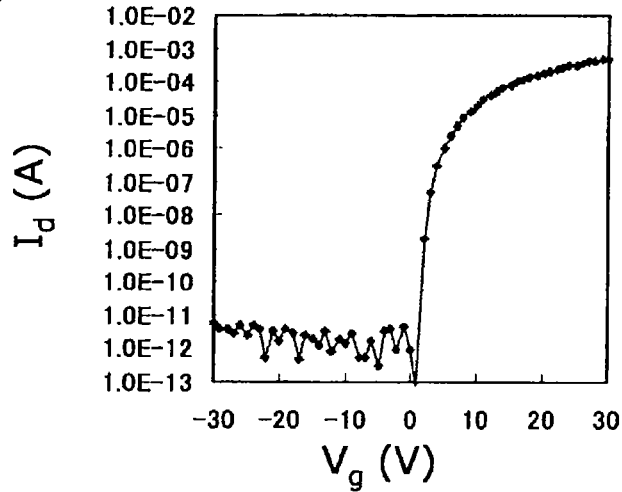
Figure 5:
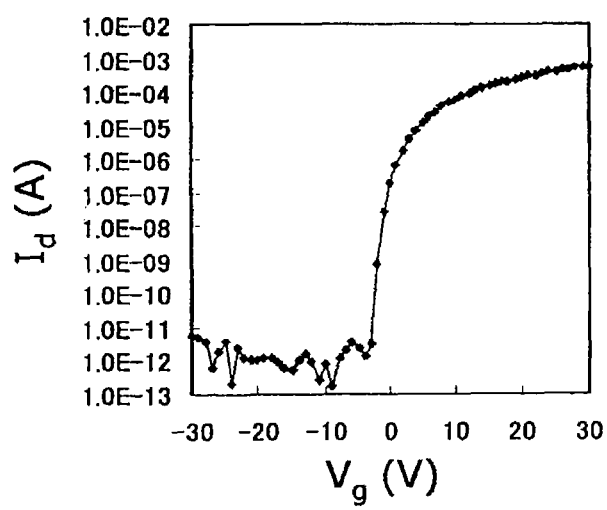
FIGS. 5(a) and 5(b) are views showing TFT characteristics before and after passivation layer formation in the case where ZTO-Ta is used.
Figure 5:
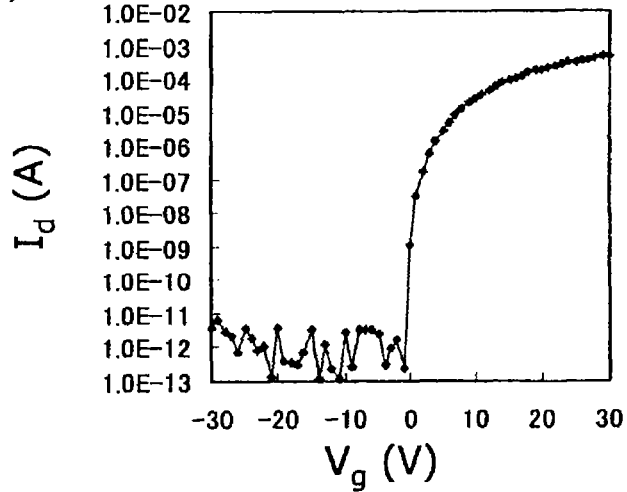
Figure 6:
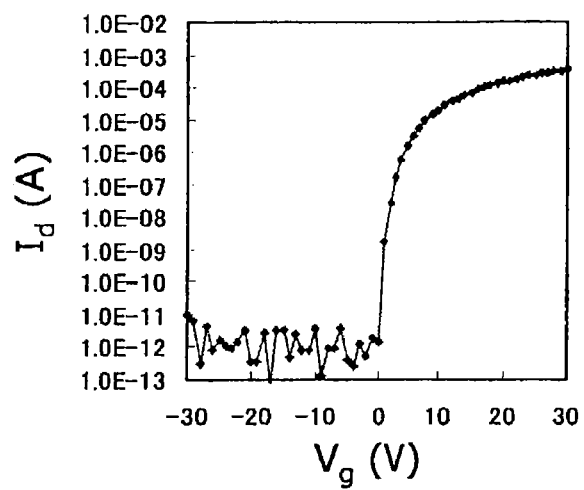
FIGS. 6(a) and 6(b) are views showing TFT characteristics before and after passivation layer formation in the case where ZTO-Ti is used.
Figure 6:
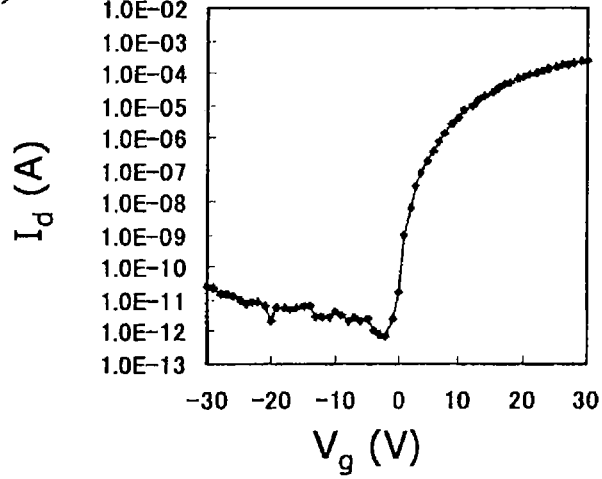
Figure 7:
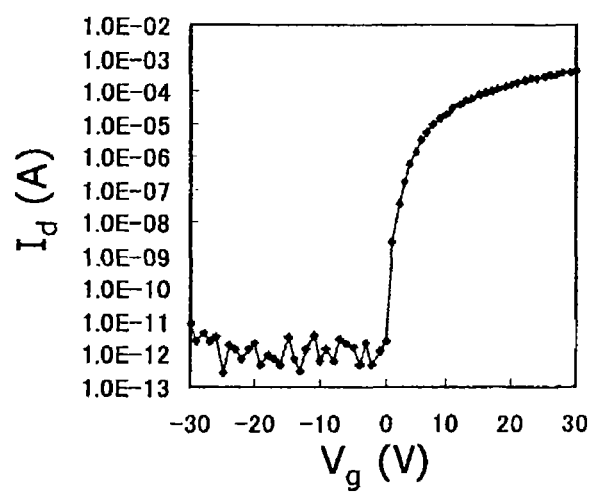
FIGS. 7(a) and 7(b) are views showing TFT characteristics before and after passivation layer formation in the case where ZTO-Nb is used
Figure 7:
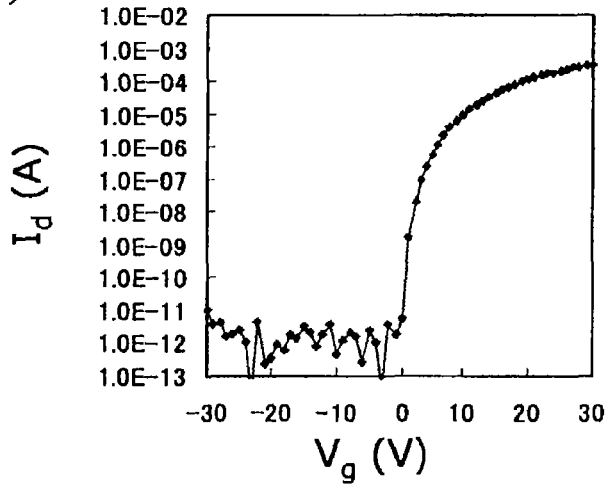
Figure 8:
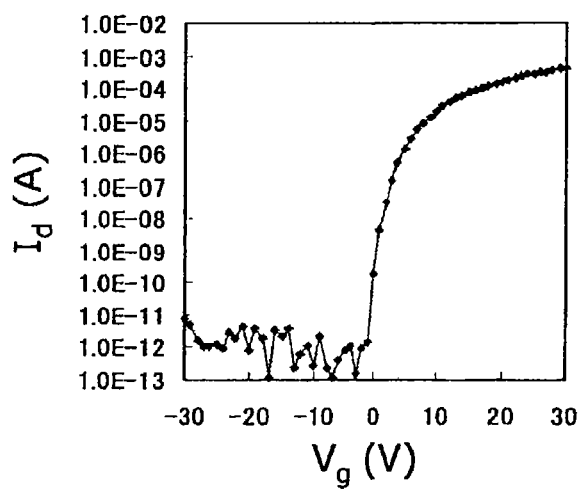
FIGS. 8(a) and 8(b) are views showing TFT characteristics before and after passivation layer formation in the case where ZTO-Mg is used.
Figure 8:
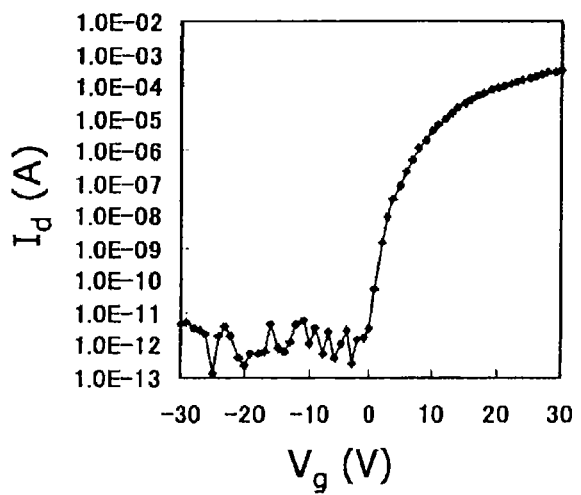
Figure 9:
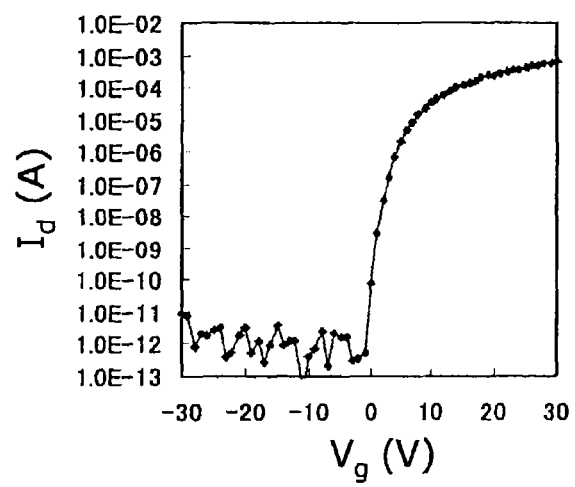
FIGS. 9(a) and 9(b) are views showing TFT characteristics before and after passivation layer formation in the case where ZTO-Sc is used.
Figure 9:
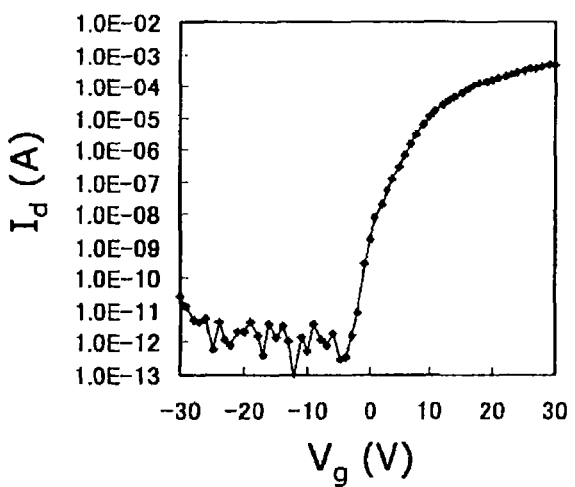
Figure 10:
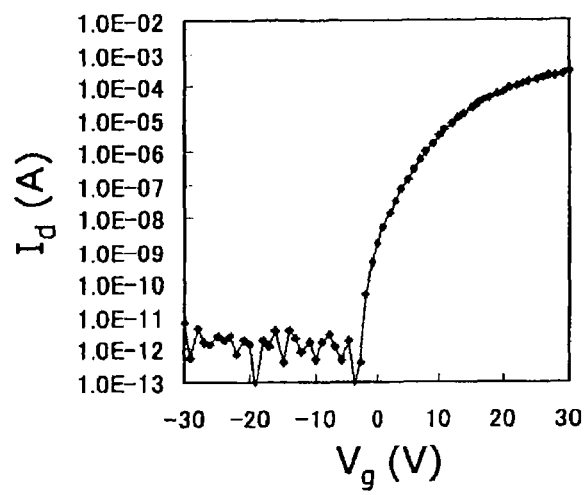
FIGS. 10(a) and 10(b) are views showing TFT characteristics before and after passivation layer formation in the case where ZTO-Y is used.
Figure 10:
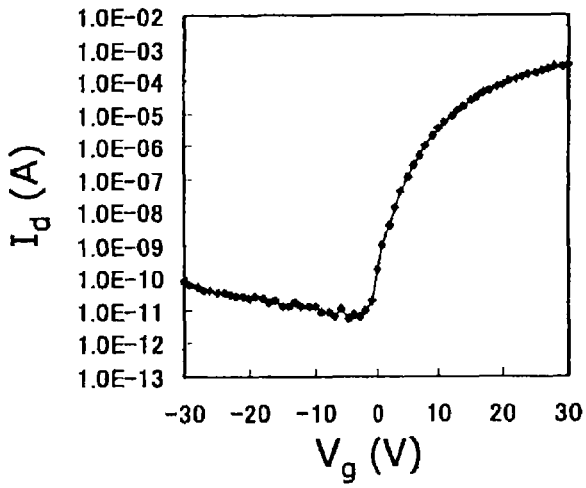
Figure 11:
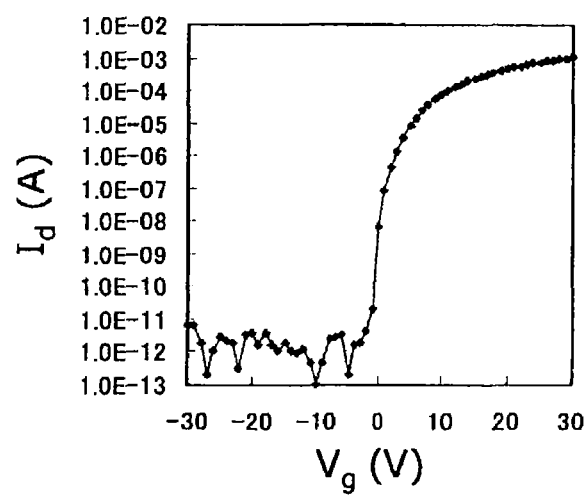
FIGS. 11(a) and 11(b) are views showing TFT characteristics before and after passivation layer formation in the case where ZTO-Ga is used.
Figure 11:
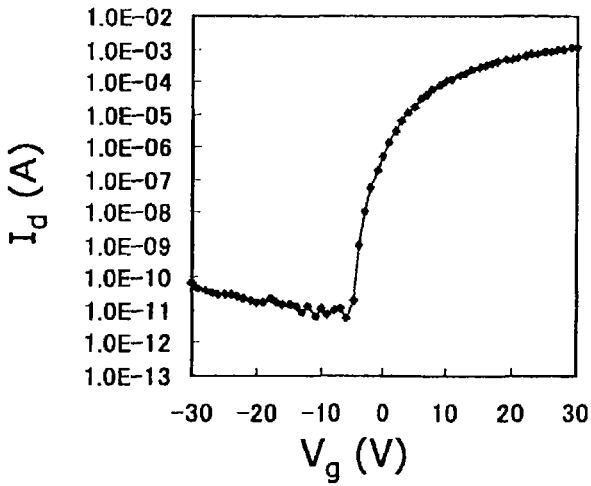
Figure 12:
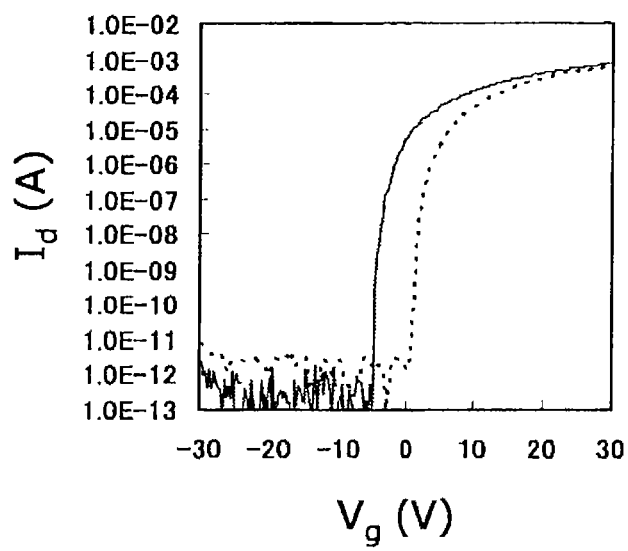
FIG. 12 is view showing TFT characteristics before and after stress tests in the case where ZTO-Mg is used: dotted line shows TFT characteristics before stress tests: and solid line shows TFT characteristics after stress tests.
Figure 13:
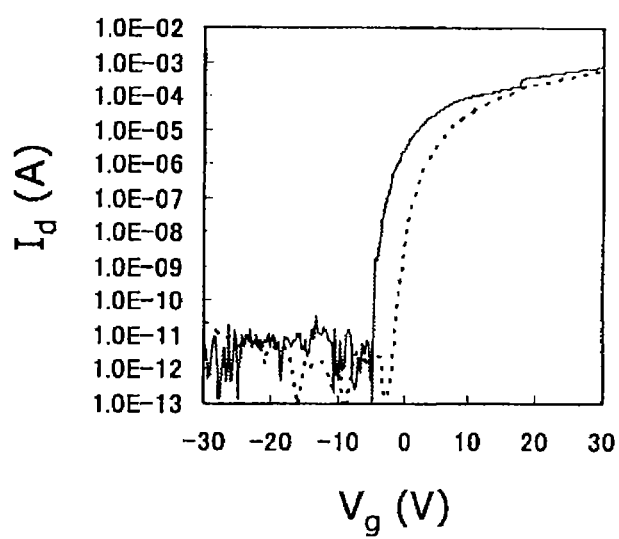
FIG. 13 is view showing TFT characteristics before and after stress tests in the case where ZTO-Nb is used: dotted line shows TFT characteristics before stress tests: and solid line shows TFT characteristics after stress tests.
Figure 14:
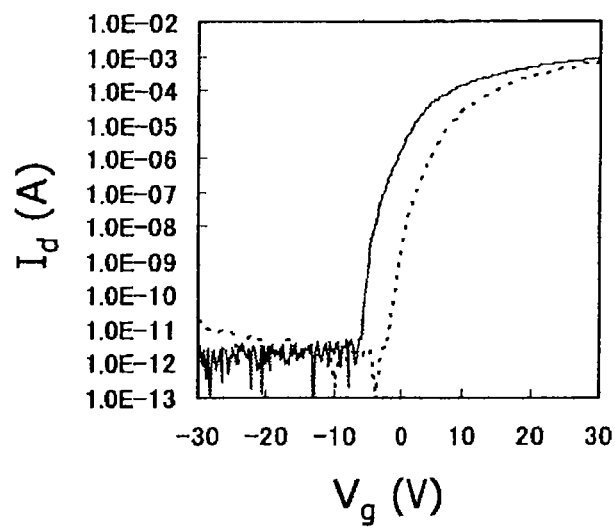
FIG. 14 is view showing TFT characteristics before and after stress tests in the case where ZTO-Sc is used: dotted line shows TFT characteristics before stress tests: and solid line shows TFT characteristics after stress tests.
Figure 15:
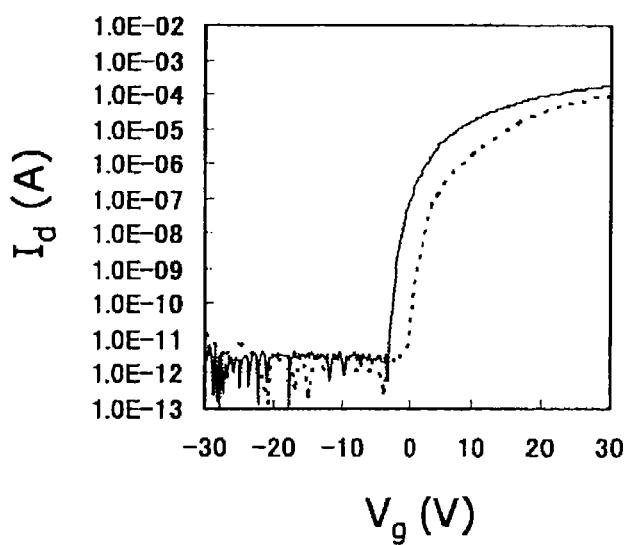
FIG. 15 is view showing TFT characteristics before and after stress tests in the case where ZTO-Ti is used: dotted line shows TFT characteristics before stress tests: and solid line shows TFT characteristics after stress tests.
Figure 16:
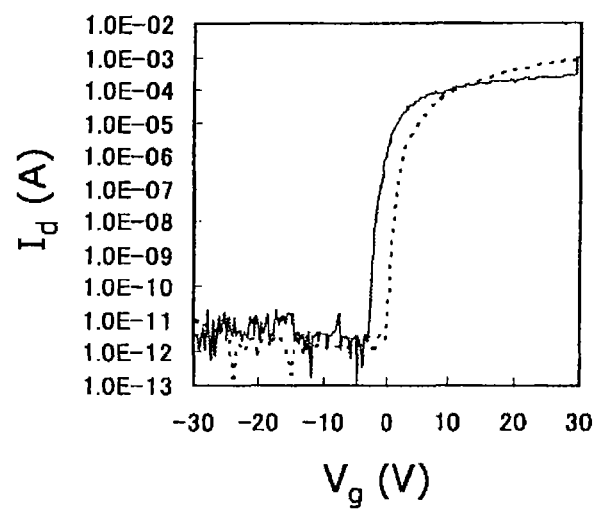
FIG. 16 is view showing TFT characteristics before and after stress tests in the case where ZTO-Al is used: dotted line shows TFT characteristics before stress tests: and solid line shows TFT characteristics after stress tests.
Figure 17:
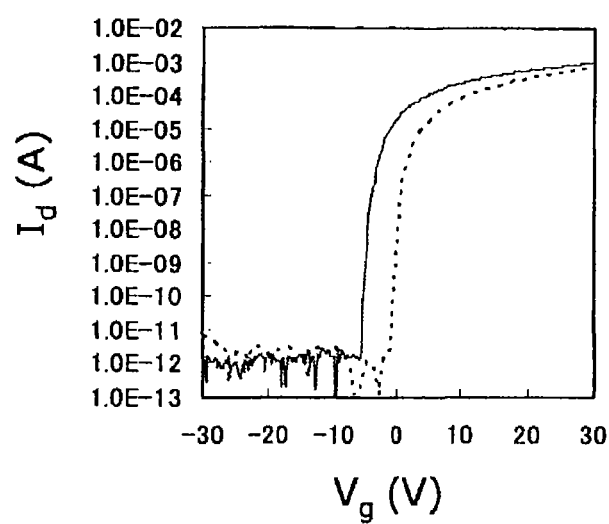
FIG. 17 is view showing TFT characteristics before and after stress tests in the case where ZTO-Hf is used: dotted line shows TFT characteristics before stress tests: and solid line shows TFT characteristics after stress tests.

Although the ON current Ion, S value, and threshold voltage Vth were all good before passivation layer formation, the threshold value could not be measured and the S value was increased or could not be measured after passivation layer formation. With reference to FIG. 2, the drain current Id started increasing from the point where the gate voltage Vg was about −10 V before passivation layer formation, and switching operation was observed [see FIG. 2(a)], whereas the switching operation was not observed at all as shown in FIG. 2(b) after passivation layer formation.

In contrast, in the case of using a ZTO+X film containing the X-group element defined by the present invention, good characteristics (see Table 1, Table 2, and FIGS. 3 to 11) were found in both before and after passivation layer formation. According to Table 1 and Table 2, it was found that the content range of the X-group element which contributes to the characteristic improvement showed a tendency to be slightly different depending of the kind of the X-group element. That is, in the case where the X-group element was an element other than Ga, generally, the Ion showed a tendency to be lowered and the S value and Vth showed a tendency to be increased as the ratio (atomic ratio) of the X-group element in the entire metal elements constituting the oxide was increased; while in the case where the X-group element was Ga, good TFT characteristics showed a tendency to be maintained even if the ratio (atomic ratio) of Ga in the entire metal elements constituting the oxide was increased, and both the Ion and the Vth scarcely showed a change and only the S value showed a tendency to be slightly increased.

Further, there was shown a tendency that the TFT characteristics was lowered (increase of Ion, and decrease of S value and Vth) as the ratio of the Zn amount (atomic ratio) to the total amounts of Zn and Sn was small; however, according to the invention, even if the above-mentioned ratio was increased to around 0.5 to 0.8 (that is, in a region where ZnO amount was high), it was confirmed that good TFT characteristics could be obtained.

According to the experimental results, it was confirmed that if an oxide semiconductor containing a prescribed amount of the X-group element defined in the present invention was used, stable TFT characteristics could be obtained even by passivation layer formation without the oxide being converted to be conductive before and after passivation layer formation. Since wet etching processing was favorably carried out, it is supposed that the oxide to which the X-group element is added has an amorphous structure.

Example 2

In this example, respective TFTs produced in the same manner as in Example 1 using various oxides thin films as described in Table 1 and Table 2 were subjected to (4) stress resistance evaluation before and after stress tests as follows.
(4) Evaluation of Stress Resistance (Light Irradiation and Negative Bias Application as Stress).

In this example, stress tests were carried out by irradiation of light while applying negative bias to a gate electrode for simulation of environments (stress) at the time of actual panel drive. The stress tests conditions were as follows. A light wavelength with about 400 nm was selected which was close to the band gap of an oxide semiconductor and with which the transistor characteristics tend to be easily fluctuated.

Gate voltage: −20V
Drain voltage: 10V
Substrate temperature: 60° C.
Light stress
Wavelength: 400 nm
Illuminance (light intensity for irradiation to TFT): 80 nW/cm$^2$
Light source: LED manufactured by OptoSupply Limited (light quantity was adjusted by an ND filter)
Stress tests time: 1 hour In this example, in the same manner as in Example 1 described above, the followings were measured: (I) the change quantity (shift quantity) of the threshold voltage (voltage in the case where drain current was around 1 nA between ON current and OFF current) and (II) transistor characteristics [ON current (Ion) at the time of Vg=30V].

These results are shown in Table 3 and Table 4. These tables showed the respective values of the shift quantity of threshold voltage after stress tests and the carrier mobility before and after stress tests. The carrier mobility (electron field-effect mobility) was calculated as the mobility in a saturation region according to the following expression. In this example, those which had a saturation mobility of 5 cm$^2$/Vs or higher obtained in this manner were regarded as accepted. These tables include those with the same composition as that of the oxide thin film used in Example 1 described above, and the respective values of "after passivation layer formation" in Table 1 and Table 2 correspond to the respective values of "before stress tests" in Table 3 and Table 4.

$$I_d = \frac{1}{2}\mu_{FE} C_{OX} \frac{W}{L}(V_{gs} - V_{th})^2 \qquad [\text{Math 1}]$$

Cox: insulator layer capacitance
W: channel width
L: channel length
Vth: threshold voltage FIGS. 12 to 21 show the results of drain current-gate voltage characteristics (Id-Vg characteristics) before and after stress tests for some examples. In these figures, the results before stress tests are shown by dotted lines and the results after stress tests are shown by solid lines.

TABLE 3

| No. | Oxide | Ratio to [Zn] + [Sn] | | [X]/ ([Zn] + [Sn] + [X]) | Before stress tests | After stress tests | |
|---|---|---|---|---|---|---|---|
| | | [Zn] | [Sn] | | Ion (A) | Ion (A) | ΔVth (V) |
| 1 | ZTO | 0.65 | 0.35 | 0 | 1.E−03 | 1.E−03 | −9 |
| 2 | ZTO + Al | 0.65 | 0.35 | 0.04 | 8.E−04 | 8.E−04 | −4 |
| 3 | | 0.60 | 0.40 | 0.03 | 7.E−04 | 7.E−04 | −7 |
| 4 | | 0.70 | 0.30 | 0.25 | 2.E−04 | 2.E−04 | −4 |
| 5 | | 0.60 | 0.40 | 0.20 | 2.E−04 | 2.E−04 | −4 |
| 6 | ZTO + Hf | 0.75 | 0.25 | 0.05 | 7.E−04 | 7.E−04 | −5 |
| 7 | | 0.65 | 0.35 | 0.15 | 3.E−04 | 3.E−04 | −7 |
| 8 | | 0.60 | 0.40 | 0.25 | 1.E−04 | 1.E−04 | −6 |
| 9 | | 0.65 | 0.35 | 0.30 | 1.E−04 | 1.E−04 | −6 |
| 10 | | 0.60 | 0.40 | 0.40 | 1.E−05 | 1.E−05 | −6 |
| 11 | ZTO + Ta | 0.75 | 0.25 | 0.10 | 4.E−04 | 4.E−04 | −7 |
| 12 | | 0.70 | 0.30 | 0.05 | 8.E−04 | 8.E−04 | −5 |
| 13 | | 0.60 | 0.40 | 0.25 | 2.E−04 | 2.E−04 | −8 |
| 14 | | 0.60 | 0.40 | 0.30 | 1.E−04 | 1.E−04 | −9 |
| 15 | | 0.55 | 0.45 | 0.15 | 6.E−04 | 6.E−04 | −8 |
| 16 | | 0.50 | 0.50 | 0.15 | 6.E−04 | 6.E−04 | −9 |
| 17 | | 0.40 | 0.60 | 0.15 | 3.E−04 | 3.E−04 | −8 |
| 18 | ZTO + Ti | 0.80 | 0.20 | 0.09 | 9.E−04 | 9.E−04 | −5 |
| 19 | | 0.75 | 0.25 | 0.06 | 4.E−04 | 4.E−04 | −9 |
| 20 | | 0.70 | 0.30 | 0.05 | 8.E−05 | 8.E−05 | −7 |
| 21 | | 0.40 | 0.60 | 0.30 | 1.E−04 | 1.E−04 | −6 |

TABLE 3-continued

| | | Ratio to [Zn] + [Sn] | | [X]/ | Before stress tests | After stress tests | |
|---|---|---|---|---|---|---|---|
| No. | Oxide | [Zn] | [Sn] | ([Zn] + [Sn] + [X]) | Ion (A) | Ion (A) | ΔVth (V) |
| 22 | ZTO + Nb | 0.80 | 0.20 | 0.05 | 3.E−04 | 3.E−04 | −9 |
| 23 | | 0.65 | 0.35 | 0.03 | 5.E−04 | 5.E−04 | −6 |
| 24 | | 0.80 | 0.20 | 0.05 | 5.E−04 | 5.E−04 | −6 |
| 25 | | 0.60 | 0.40 | 0.05 | 4.E−04 | 5.E−04 | −7 |
| 26 | ZTO + Mg | 0.70 | 0.30 | 0.10 | 3.E−04 | 3.E−04 | −8 |
| 27 | | 0.65 | 0.35 | 0.05 | 5.E−04 | 5.E−04 | −7 |
| 28 | | 0.75 | 0.25 | 0.03 | 6.E−04 | 6.E−04 | −7 |
| 29 | | 0.55 | 0.45 | 0.30 | 1.E−04 | 1.E−04 | −6 |

TABLE 4

| | | Ratio to [Zn] + [Sn] | | [X]/ | Before stress tests | After stress tests | |
|---|---|---|---|---|---|---|---|
| No. | Oxide | [Zn] | [Sn] | ([Zn] + [Sn] + [X]) | Ion (A) | Ion (A) | Vth (V) |
| 1 | ZTO + Sc | 0.70 | 0.30 | 0.03 | 6.E−04 | 6.E−04 | −7 |
| 2 | | 0.55 | 0.45 | 0.15 | 4.E−04 | 4.E−04 | −8 |
| 3 | | 0.40 | 0.60 | 0.15 | 5.E−04 | 5.E−04 | −7 |
| 4 | | 0.65 | 0.35 | 0.40 | 1.E−05 | 1.E−05 | −8 |
| 5 | ZTO + Y | 0.80 | 0.20 | 0.05 | 7.E−04 | 7.E−04 | −7 |
| 6 | | 0.70 | 0.30 | 0.05 | 9.E−04 | 9.E−04 | −7 |
| 7 | | 0.50 | 0.50 | 0.25 | 2.E−04 | 2.E−04 | −7 |
| 8 | | 0.40 | 0.60 | 0.30 | 2.E−04 | 2.E−04 | −7 |
| 9 | ZTO + La | 0.55 | 0.45 | 0.02 | 6.E−04 | 6.E−04 | −3 |
| 10 | | 0.55 | 0.45 | 0.15 | 4.E−04 | 4.E−04 | −5 |
| 11 | | 0.40 | 0.60 | 0.30 | 4.E−04 | 4.E−04 | −6 |
| 12 | ZTO + Ga | 0.80 | 0.20 | 0.40 | 1.E−03 | 1.E−03 | −4 |
| 13 | | 0.75 | 0.25 | 0.20 | 1.E−03 | 1.E−03 | −3 |
| 14 | | 0.50 | 0.50 | 0.30 | 1.E−03 | 1.E−03 | −7 |
| 15 | | 0.40 | 0.60 | 0.40 | 1.E−03 | 1.E−03 | −4 |
| 16 | | 0.60 | 0.40 | 0.40 | 8.E−04 | 8.E−04 | −3 |
| 17 | | 0.75 | 0.25 | 0.30 | 7.E−04 | 7.E−04 | −3 |
| 18 | | 0.55 | 0.45 | 0.45 | 1.E−03 | 1.E−03 | −5 |
| 19 | | 0.55 | 0.45 | 0.45 | 1.E−03 | 1.E−03 | −5 |
| 20 | ZTO + Al + Ta | 0.70 | 0.30 | Al: 0.02 Ta: 0.02 | 8.E−04 | 8.E−04 | −7 |
| 21 | | 0.70 | 0.30 | Al: 0.05 Ta: 0.1 | 6.E−04 | 6.E−04 | −6 |
| 22 | | 0.60 | 0.40 | Al: 0.1 Ta: 0.1 | 5.E−04 | 5.E−04 | −7 |
| 23 | ZTO + Al + La | 0.70 | 0.30 | Al: 0.02 La: 0.02 | 8.E−04 | 8.E−04 | −5 |
| 24 | ZTO + Al + Ga | 0.70 | 0.30 | Al: 0.05 Ga: 0.1 | 6.E−04 | 6.E−04 | −5 |
| 25 | ZTO + Ta + Ga | 0.60 | 0.40 | Ta: 0.1 Ga: 0.1 | 7.E−04 | 7.E−04 | −6 |
| 26 | ZTO + Al + La | 0.70 | 0.30 | Al: 0.1 La: 0.05 | 3.E−04 | 3.E−04 | −5 |

First, the results (No. 1 in Table 3 and FIG. 18) of a conventional example using ZTO will be discussed.

Figure 18:
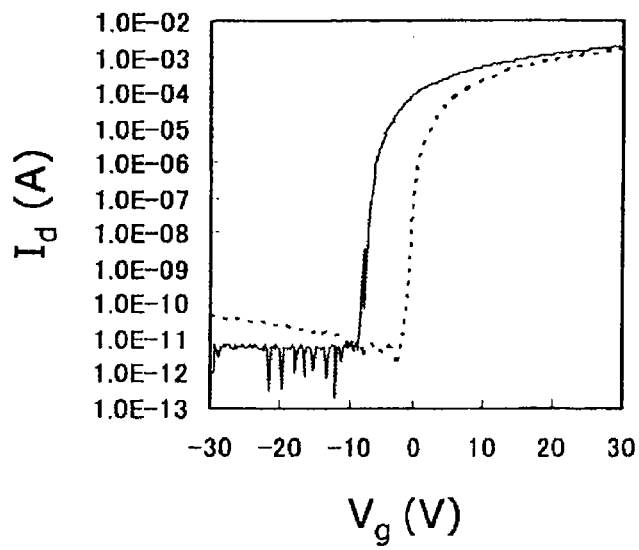
FIG. 18 is view showing TFT characteristics before and after stress tests in the case where ZTO (conventional example) is used: dotted line shows TFT characteristics before stress tests: and solid line shows TFT characteristics after stress tests.
Figure 19:
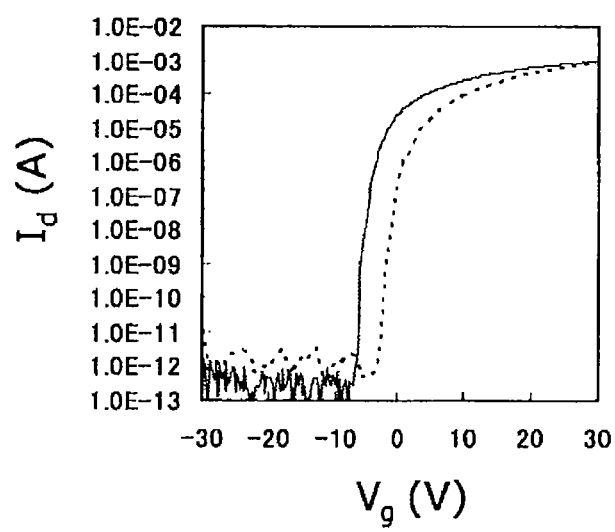
FIG. 19 is view showing TFT characteristics before and after stress tests in the case where ZTO-Ta is used: dotted line shows TFT characteristics before stress tests: and solid line shows TFT characteristics after stress tests.
Figure 20:
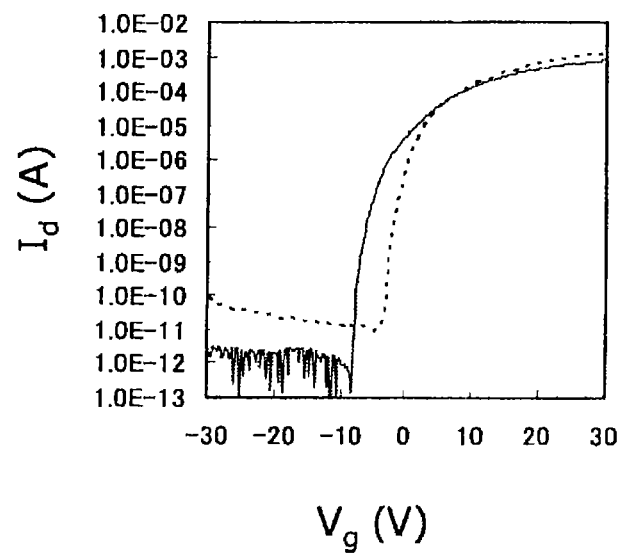
FIG. 20 is view showing TFT characteristics before and after stress tests in the case where ZTO-Ga is used: dotted line shows TFT characteristics before stress tests: and solid line shows TFT characteristics after stress tests.
Figure 21:
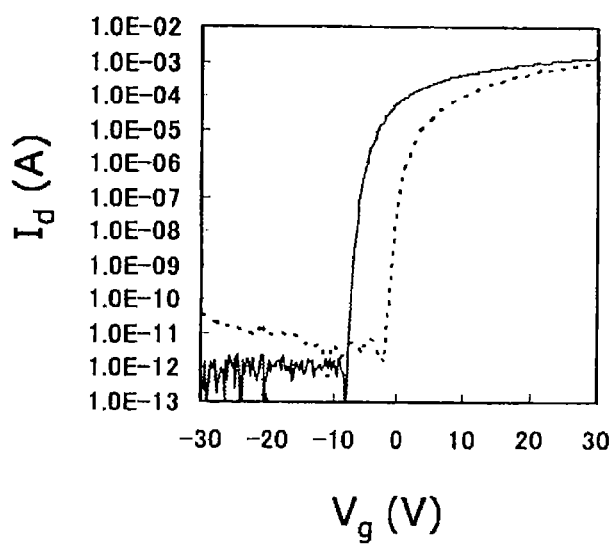
FIG. 21 is view showing TFT characteristics before and after stress tests in the case where ZTO-Y is used: dotted line shows TFT characteristics before stress tests: and solid line shows TFT characteristics after stress tests.

As shown in FIG. 18, the drain current Id started increasing from the point where the gate voltage Vg was about −3V before stress tests (in the figure, the dotted line) and switching operation was observed. If Id at the time of Vg=−30V is defined as OFF current Ioff (A) and Id at the time of Vg=30V is defined as ON current Ion (A), the Ion/Ioff ratio is 8 digits or higher. The Ion before stress tests was $1.0 \times 10^{-3}$ A (see Table 3).

In contrast, Ion was $1.0 \times 10^{-3}$ A (see Table 3) after stress tests and thus the value was scarcely changed before and after stress tests; whereas as shown in FIG. 18, the threshold value was significantly changed and the shift quantity of the threshold value between 0 hour (free from stress) to 1 hour (stress tests) was −9V (see Table 3).

In this example, based on the result of No. 1, those with the same as or smaller than the result of No. 1 were regarded as accepted.

In Table 3, Nos. 2 to 4 (X-group element=Al), 6 to 9 (X-group element=Hf), 11 to 17 (X-group element=Ta), 18 to 21 (X-group element=Ti), 22 to 25 (X-group element=Nb), 26 to 29 (X-group element=Mg); in Table 4, Nos. 1 to 4 (X-group element=Sc), 5 to 8 (X-group element=Y), 9 to 11 (X-group element=La), 12 to 19 (X-group element=Ga), 20 to 22 (X-group element=Al+Ta), 23 (X-group element=Al+La), 24 (X-group element=Al+Ga), 25 (X-group element=Ta+Ga), 26 (X-group element=Al+La) were examples using oxide semiconductors containing the X-group element defined by the present invention within a preferably prescribed range, and all showed lower absolute values of the threshold voltage shift quantity and also showed equal to or lower Ion before and after stress tests as compared with those of No. 1.

No. 5 (X-group element=Al) and 10 (X-group element=Hf) in Table 3 were examples using oxide semiconductors which did not contain the X-group element defined by the present invention within a preferably prescribed range, and as shown in Example 1, TFT characteristics were lowered after passivation layer formation; however, the TFT characteristics themselves were good before and after stress tests.

The results of TFT characteristics of No. 28 (X-group element=Mg) in Table 3, No. 25 (X-group element=Nb) in Table 3, No. 1 (X-group element =Sc) in Table 4, No. 18 (X-group element=Ti) in Table 3, No. 3 (X-group element=Al) in Table 3, No. 6 (X-group element=Hf) in Table 3, No. 12 (X-group element=Ta) in Table 3, No. 17 (X-group element=Ga) in Table 4, and No. 6 (X-group element=Y) in Table 4 are shown in FIGS. 12 to 17 and 19 to 21, respectively. In the figures, the dotted lines show the results of the TFT characteristics before stress tests and the solid lines show the results of the TFT characteristics after stress tests.

According to the experimental results, it was confirmed that if an oxide semiconductor containing a prescribed amount of the X-group element defined in the present invention was used, TFT characteristics as good as those of the case of using conventional ZTO could be obtained. Since wet etching processing was favorably carried out, it is supposed that the oxide to which the X-group element is added has an amorphous structure.

According to the results of Example 1 and Example 2, it was confirmed that if the oxide of the present invention was used, good TFT characteristics could be obtained after passivation layer formation and after stress tests.

Example 3

In this example, the densities of oxide films (film thickness 100 nm) formed by using an oxide with the composition corresponding to No. 3 in Table 3 (ZnSnO+3 atomic % Al, [Zn]:[Sn]=6:4, Zn ratio=[Zn]/([Zn]+[Sn])=0.6, and Al ratio=[Al]/([Zn]+[Sn]+[Al])=0.03) and controlling the gas pressure at the time of sputtering film formation to 1 mTorr, 3 mTorr, or 5 mTorr were measured, and the mobility and the change quantity (ΔVth) of threshold voltage after the stress test (light irradiation+negative bias application) were investigated for a TFT produced in the same manner as in Example 2 described above. A method for measuring the film density is as follows.
(Measurement of Density of Oxide Film)

The density of the oxide film was measured by XRR (X-ray reflectivity method). The detailed measurement conditions were as follows.

Analysis apparatus: Horizontal type x-ray diffraction apparatus Smart Lab manufactured by Rigaku Co., Ltd.
Target: Cu (beam source: Kα ray)
Target output power: 45 kV-200 mA
Production of Measurement Sample A sample used was produced by forming a film (film thickness 100 nm) of an oxide with each composition on a glass substrate in the following sputtering conditions, and thereafter carrying out the same heat treatment as that for pre-annealing treatment simulating the pre-annealing treatment in the TFT production process of Example 1 as described above.

Sputtering gas pressure: 1 mTorr, 3 mTorr, or 5 mTorr
Oxygen partial pressure: $O_2/(Ar+O_2)$=2%
Film formation power density: DC 2.55 W/cm$^2$
Heat treatment: 350° C. for 1 hour under an air atmosphere These results are shown in Table 5.

TABLE 5

| No. | Composition | Gas pressure at the time of film formation (mTorr) | Density (g/cm$^3$) | Mobility (cm$^2$/Vs) | ΔVth (V) |
|---|---|---|---|---|---|
| 1 | Same as No. 3 | 1 | 6.2 | 10.2 | −4.0 |
| 2 | in Table 3 | 3 | 6.0 | 8.3 | −5.1 |
| 3 |  | 5 | 5.8 | 6.4 | −6.5 |

According to Table 5, the oxides in Table 5 containing Al as the X-group element defined by the present invention all showed a high density of 5.8 g/cm$^3$ or higher. More in detail, the film density at the time of a gas pressure of 5 mTorr (No. 3) was 5.8 g/cm$^3$, whereas the film density at the time of a gas pressure of 3 mTorr (No. 2) was 6.0 g/cm$^3$ and the film density at the time of a gas pressure of 1 mTorr (No. 1) was 6.2 g/cm$^3$, and as the gas pressure was lowered, a higher density was obtained. Further, as the film density was increased, the electron field-effect mobility was improved and the absolute value of the shift quantity ΔVth of threshold value by the stress test was also lowered.

According to the experimental results, it was found that the density of the oxide film was changed in accordance with the gas pressure at the time of sputtering film formation, and if the gas pressure was lowered, the film density was increased and accordingly, the electron field-effect mobility was increased significantly and the absolute value of the shift quantity ΔVth of threshold voltage in the stress test (light irradiation+negative bias stress) was decreased. That is supposedly attributed to that the disturbance of sputtered atoms (molecules) can be suppressed by lowering the gas pressure at the time of sputtering film formation to lessen the defects in the film, and thus the mobility and the electric conductivity are increased to improve the TFT stability.

While the present application has been described in detail with reference to specific embodiments, however, it is apparent for those skilled in the art to make various modifications and alteration without departing from the true spirit and scope of the present invention.

The present application is based on Japanese Patent Application No. 2010-097350 filed on Apr. 20, 2010, Japanese Patent Application No. 2010-156232 filed on Jul. 8, 2010, and Japanese Patent Application No. 2011-008324 filed on Jan. 18, 2011, and their contents are incorporated herein by reference.

INDUSTRIAL APPLICABILITY

According to the present invention, a ZTO-based oxide for a semiconductor layer excellent in switching characteristics and stress resistance for a thin-film transistor can be obtained. If the oxide for a semiconductor layer of the present invention is used, it is possible to provide a thin-film transistor which can give stable and excellent characteristics even in a region where the ZnO concentration in the oxide semiconductor is high (specifically, a region with approximately 0.6 or higher as the ratio (atomic ratio) of Zn in Zn and Sn constituting the oxide semiconductor), and even after forming a passivation layer and after applying stress. As a result, if the above-mentioned thin-film transistor is used, a display device with high reliability can be obtained.

EXPLANATION OF REFERENCE NUMERALS

1 Substrate
2 Gate electrode
3 Gate insulator layer
4 Oxide semiconductor layer
5 Source-drain electrode
6 Passivation layer (insulator layer)
7 Contact hole
8 Transparent conductive film

The invention claimed is:

1. An oxide, comprising Zn, Sn, and at least one element X selected from the group consisting of Al, Hf, Ta, Ti, Nb, Mg, Ga, and rare earth elements, wherein:
  a ratio of [Ga]/([Zn]+[Sn]+[Ga]) is 0.15 or higher and 0.5 or lower;
  a ratio of [X1]/([Zn]+[Sn]+[X1]) is 0.15 or higher and 0.3 or lower;
  [Ga] represents a content (atomic %) of Ga;
  [Zn] represents a content (atomic %) of Zn;
  [Sn] represents a content (atomic %) of Sn; and
  [X1] represents a total content (atomic %) of Al, Hf, Ta, Ti, Nb, Mg, and rare earth elements.

2. The oxide according to claim 1, wherein:
  a ratio of [Zn]/([Zn]+[Sn]) is 0.8 or lower;
  [Zn] represents a content (atomic %) of Zn; and
  [Sn] represents a content (atomic %) of Sn.

3. A thin-film transistor, comprising the oxide according to claim 1 as a semiconductor layer.

4. The thin-film transistor according to claim 3, wherein a density of the semiconductor layer is 5.8 g/cm$^3$ or higher.

5. A sputtering target, comprising Zn, Sn, and at least one element X selected from the group consisting of Al, Hf, Ta, Ti, Nb, Mg, Ga, and rare earth elements, wherein:
  the sputtering target is suitable for forming the oxide according to claim 1;
  a ratio of [Ga]/([Zn]+[Sn]+[Ga]) is 0.15 or higher and 0.5 or lower;
  a ratio of [X1]/([Zn]+[Sn]+[X1]) is 0.15 or higher and 0.3 or lower;
  [Ga] represents a content (atomic %) of Ga;
  [Zn] represents a content (atomic %) of Zn;
  [Sn] represents a content (atomic %) of Sn; and
  [X1] represents a total content (atomic %) of Al, Hf, Ta, Ti, Nb, Mg, and rare earth elements.

6. The sputtering target according to claim 5, wherein:
  a the ratio of [Zn]/([Zn]+[Sn]) is 0.8 or lower;
  [Zn] represents a content (atomic %) of Zn; and
  [Sn] represents a content (atomic %) of Sn.

7. A sputtering target, comprising Zn, Sn, and at least one element X selected from the group consisting of Al, Hf, Ta, Ti, Nb, Mg, Ga, and rare earth elements, wherein the sputtering target is suitable for forming the oxide according to claim 2.

* * * * *